(12) United States Patent
Olsson

(10) Patent No.: US 12,382,656 B2
(45) Date of Patent: Aug. 5, 2025

(54) REINFORCED THIN-FILM DEVICE

(71) Applicant: Epinovatech AB, Lund (SE)

(72) Inventor: Martin Andreas Olsson, Lund (SE)

(73) Assignee: Epinovatech AB, Lund (SE)

( * ) Notice: Subject to any disclaimer, the term of this patent is extended or adjusted under 35 U.S.C. 154(b) by 0 days.

(21) Appl. No.: 18/739,078

(22) Filed: Jun. 10, 2024

(65) Prior Publication Data
US 2024/0332423 A1   Oct. 3, 2024

Related U.S. Application Data

(63) Continuation of application No. 17/929,440, filed on Sep. 2, 2022, now Pat. No. 12,009,431, which is a
(Continued)

(30) Foreign Application Priority Data

Apr. 22, 2018 (SE) .................... 1830140-8

(51) Int. Cl.
  *H10D 30/62* (2025.01)
  *H01L 21/02* (2006.01)
  (Continued)

(52) U.S. Cl.
  CPC ... *H10D 30/6211* (2025.01); *H01L 21/02381* (2013.01); *H01L 21/02527* (2013.01);
  (Continued)

(58) Field of Classification Search
  None
  See application file for complete search history.

(56) References Cited

U.S. PATENT DOCUMENTS

| | | | |
|---|---|---|---|
| 2,463,073 | A | 3/1949 | Webb |
| 4,103,325 | A | 7/1978 | Hyman et al. |

(Continued)

FOREIGN PATENT DOCUMENTS

| | | |
|---|---|---|
| CN | 101621292 | 5/2012 |
| CN | 103477418 | 12/2013 |

(Continued)

OTHER PUBLICATIONS

Alamo et al., III-V CMOS: the key to sub-10 nm electronics?, Microsystems Technology Laboratories, MIT, 2011 MRS Spring Meeting and Exhibition Symposium P: Interface Engineering for Post-CMOS Emerging Channel Materials.
(Continued)

*Primary Examiner* — Scott B Geyer
(74) *Attorney, Agent, or Firm* — Knobbe, Martens, Olson & Bear, LLp

(57) ABSTRACT

A reinforced thin-film device is disclosed. The reinforced thin-film device comprising: a substrate having a top surface for supporting an epilayer; a mask layer patterned with a plurality of nanosize cavities disposed on said substrate to form a needle pad; a thin-film of, relative to the substrate, lattice-mismatched semiconductor disposed on said mask layer, wherein said thin-film comprises a plurality of in parallel spaced semiconductor needles of said lattice-mismatched semiconductor embedded in said thin-film, wherein said plurality of semiconductor needles are vertically disposed in the axial direction towards said substrate in said plurality of nanosize cavities of said mask layer; a, relative to the substrate, lattice-mismatched semiconductor epilayer provided on said thin-film and supported thereby; and a FinFET transistor arranged on the lattice-mismatched semiconductor epilayer. The FinFET transistor comprising: a fin semiconductor structure comprising an elongate protruding
(Continued)

core portion, the fin semiconductor structure being arranged on the lattice-mismatched semiconductor epilayer, a first and a second nanostructured electrode radially enclosing respectively a source end and a drain end of the protruding core portion, and a nanostructured gate electrode radially enclosing a central portion of the protruding core portion, the central portion being a portion of the protruding core portion between the source end and the drain end.

16 Claims, 11 Drawing Sheets

Related U.S. Application Data continuation of application No. 17/049,535, filed as application No. PCT/EP2019/060258 on Apr. 23, 2019, now Pat. No. 11,469,300.

(51) Int. Cl.

| | | |
|---|---|---|
| *H10D 30/43* | (2025.01) | |
| *H10D 62/10* | (2025.01) | |
| *H10D 62/80* | (2025.01) | |
| *H10D 62/83* | (2025.01) | |
| *H10D 62/85* | (2025.01) | |
| *H10D 84/85* | (2025.01) | |
| *H10H 20/812* | (2025.01) | |
| *H10H 20/821* | (2025.01) | |
| *H10H 20/825* | (2025.01) | |
| *H10N 60/10* | (2023.01) | |
| *H10N 60/83* | (2023.01) | |
| *H10N 60/85* | (2023.01) | |
| *G01N 27/414* | (2006.01) | |

(52) U.S. Cl.
CPC .... *H01L 21/02532* (2013.01); *H01L 21/0254* (2013.01); *H01L 21/02546* (2013.01); *H01L 21/02603* (2013.01); *H01L 21/0262* (2013.01); *H01L 21/02639* (2013.01); *H10D 30/43* (2025.01); *H10D 62/122* (2025.01); *H10D 62/83* (2025.01); *H10D 62/85* (2025.01); *H10D 62/882* (2025.01); *H10D 84/853* (2025.01); *H10H 20/812* (2025.01); *H10H 20/821* (2025.01); *H10H 20/825* (2025.01); *H10N 60/128* (2023.02); *H10N 60/83* (2023.02); *H10N 60/85* (2023.02); *G01N 27/4146* (2013.01); *H10D 30/6219* (2025.01)

(56) References Cited

U.S. PATENT DOCUMENTS

| | | | | |
|---|---|---|---|---|
| 4,873,497 | A | | 10/1989 | Kielmeyer |
| 5,362,972 | A | * | 11/1994 | Yazawa .............. H10D 62/118 257/E21.441 |
| 5,976,957 | A | * | 11/1999 | Westwater ........ H01L 21/02639 438/22 |
| 6,306,734 | B1 | * | 10/2001 | Givargizov ....... H01L 21/02603 349/1 |
| 6,734,451 | B2 | * | 5/2004 | Eriguchi ................ G11C 23/00 257/17 |
| 7,250,359 | B2 | | 7/2007 | Fitzgerald |
| 7,432,522 | B2 | * | 10/2008 | Samuelson ....... H01L 21/02395 977/932 |
| 7,829,362 | B2 | * | 11/2010 | Fukutani ............ G01N 27/4146 257/E21.409 |
| 8,094,223 | B1 | | 1/2012 | De Wit et al. |
| 8,324,660 | B2 | | 12/2012 | Lochtefeld et al. |
| 8,344,242 | B2 | | 1/2013 | Fiorenza et al. |
| 8,835,905 | B2 | * | 9/2014 | Wober ................. H10F 30/223 257/52 |
| 9,000,353 | B2 | * | 4/2015 | Seo ....................... H10F 39/016 250/208.2 |
| 9,275,857 | B1 | | 3/2016 | Hersee |
| 9,379,204 | B2 | | 6/2016 | Fogel et al. |
| 9,406,709 | B2 | * | 8/2016 | Seo ........................ H04N 23/54 |
| 9,764,950 | B2 | | 9/2017 | Colinge et al. |
| 9,887,637 | B1 | | 2/2018 | Shah et al. |
| 9,979,326 | B1 | | 5/2018 | Zanelato et al. |
| 9,984,872 | B2 | | 5/2018 | Park et al. |
| 10,263,149 | B2 | * | 4/2019 | Samuelson ......... H10D 62/122 |
| 10,387,792 | B1 | | 8/2019 | Ladd et al. |
| 10,439,671 | B2 | | 10/2019 | Kamgaing et al. |
| 10,742,208 | B1 | | 8/2020 | Moyer et al. |
| 11,316,165 | B2 | | 4/2022 | Olsson |
| 11,469,300 | B2 | | 10/2022 | Olsson |
| 11,634,824 | B2 | | 4/2023 | Olsson |
| 11,652,454 | B2 | | 5/2023 | Olsson |
| 11,695,066 | B2 | | 7/2023 | Olsson |
| 11,955,972 | B2 | | 4/2024 | Olsson |
| 12,009,431 | B2 | | 6/2024 | Olsson |
| 12,027,989 | B2 | | 7/2024 | Olsson |
| 2003/0022395 | A1 | | 1/2003 | Olds |
| 2003/0165418 | A1 | | 9/2003 | Ajayan |
| 2005/0159000 | A1 | | 7/2005 | Ohno et al. |
| 2005/0189566 | A1 | | 9/2005 | Matsumoto et al. |
| 2006/0134883 | A1 | | 6/2006 | Hantschel |
| 2006/0189018 | A1 | | 8/2006 | Yi |
| 2007/0108435 | A1 | | 5/2007 | Harmon |
| 2007/0197396 | A1 | | 8/2007 | Holcomb |
| 2007/0215899 | A1 | | 9/2007 | Thomas |
| 2007/0295993 | A1 | | 12/2007 | Chen et al. |
| 2008/0001169 | A1 | * | 1/2008 | Lochtefeld ......... H01L 21/0254 257/190 |
| 2008/0122418 | A1 | | 5/2008 | Biere et al. |
| 2008/0153000 | A1 | | 6/2008 | Salot et al. |
| 2008/0171424 | A1 | | 7/2008 | Li |
| 2009/0269909 | A1 | | 10/2009 | Kim |
| 2010/0097027 | A1 | | 4/2010 | Jackson |
| 2010/0176459 | A1 | | 7/2010 | Wernersson et al. |
| 2010/0259186 | A1 | | 10/2010 | Ernoux |
| 2010/0276664 | A1 | | 11/2010 | Hersee |
| 2010/0276665 | A1 | | 11/2010 | Wang |
| 2010/0314617 | A1 | | 12/2010 | Ito |
| 2011/0020704 | A1 | | 1/2011 | Fukuchi |
| 2011/0036396 | A1 | | 2/2011 | Jayaraman |
| 2011/0140072 | A1 | | 6/2011 | Varangis |
| 2011/0143472 | A1 | | 6/2011 | Seifert |
| 2011/0204381 | A1 | | 8/2011 | Okada et al. |
| 2011/0233575 | A1 | | 9/2011 | Huang et al. |
| 2012/0001153 | A1 | | 1/2012 | Hersee |
| 2012/0235117 | A1 | | 9/2012 | Takashi et al. |
| 2012/0292592 | A1 | | 11/2012 | Hwang et al. |
| 2013/0061747 | A1 | | 3/2013 | Turnbull et al. |
| 2013/0126907 | A1 | | 5/2013 | Kitano et al. |
| 2013/0175501 | A1 | | 7/2013 | Hersee |
| 2013/0187627 | A1 | | 7/2013 | Imada et al. |
| 2013/0292683 | A1 | * | 11/2013 | Shah ................... H10D 62/8503 257/E21.364 |
| 2014/0008609 | A1 | | 1/2014 | Chiu |
| 2014/0078781 | A1 | | 3/2014 | Imada |
| 2014/0134773 | A1 | | 5/2014 | Rakesh et al. |
| 2014/0183446 | A1 | | 7/2014 | Nago et al. |
| 2014/0197130 | A1 | | 7/2014 | Lemke |
| 2014/0231870 | A1 | | 8/2014 | Hoke |
| 2014/0239346 | A1 | | 8/2014 | Green et al. |
| 2015/0014631 | A1 | | 1/2015 | Ohlsson |
| 2015/0060996 | A1 | | 3/2015 | Colinge |
| 2015/0076450 | A1 | | 3/2015 | Weman |
| 2015/0084685 | A1 | | 3/2015 | Hirose et al. |
| 2015/0118572 | A1 | | 4/2015 | Lund et al. |
| 2015/0155275 | A1 | | 6/2015 | Bahramian et al. |
| 2015/0171784 | A1 | | 6/2015 | Lipo et al. |
| 2015/0236134 | A1 | | 8/2015 | Zhong et al. |
| 2015/0263100 | A1 | | 9/2015 | Deboy |
| 2015/0311072 | A1 | | 10/2015 | Aagesen |
| 2015/0318448 | A1 | | 11/2015 | Nan et al. |
| 2015/0333216 | A1 | | 11/2015 | Pourquire |

(56) References Cited

U.S. PATENT DOCUMENTS

| | | |
|---|---|---|
| 2016/0172305 A1 | 6/2016 | Sato |
| 2016/0211789 A1 | 7/2016 | Hanft et al. |
| 2016/0276433 A1 | 9/2016 | Holland |
| 2017/0002471 A1 | 1/2017 | Okamoto |
| 2017/0062213 A1 | 3/2017 | Patolsky |
| 2017/0110332 A1 | 4/2017 | Beveridge |
| 2017/0125574 A1 | 5/2017 | Chowdhury et al. |
| 2017/0178971 A1 | 6/2017 | Merckling et al. |
| 2017/0200820 A1 | 7/2017 | Conway et al. |
| 2017/0229569 A1 | 8/2017 | Chowdhury et al. |
| 2017/0257025 A1 | 9/2017 | Meiser |
| 2017/0309736 A1 | 10/2017 | Huang et al. |
| 2017/0323788 A1 | 11/2017 | Mi |
| 2017/0338277 A1 | 11/2017 | Banna et al. |
| 2018/0033889 A1 | 2/2018 | Yang et al. |
| 2018/0316383 A1 | 11/2018 | Kamgaing et al. |
| 2019/0013404 A1 | 1/2019 | Carlson et al. |
| 2019/0081164 A1 | 3/2019 | Shrivastava |
| 2019/0165182 A1 | 5/2019 | Van Dal |
| 2019/0229149 A1 | 7/2019 | Yoo |
| 2019/0252377 A1 | 8/2019 | Clarke et al. |
| 2019/0284706 A1 | 9/2019 | Takeda et al. |
| 2019/0356278 A1 | 11/2019 | Smith |
| 2019/0393104 A1 | 12/2019 | Ando |
| 2020/0027972 A1 | 1/2020 | Petta et al. |
| 2020/0127173 A1 | 4/2020 | Park et al. |
| 2020/0161531 A1 | 5/2020 | Olivadese et al. |
| 2020/0185219 A1 | 6/2020 | Busani et al. |
| 2020/0194416 A1 | 6/2020 | Or-Bach et al. |
| 2020/0203556 A1 | 6/2020 | Feuillet et al. |
| 2020/0381538 A1 | 12/2020 | Shih et al. |
| 2021/0057601 A1 | 2/2021 | Oliver et al. |
| 2021/0265632 A1 | 8/2021 | Olsson |
| 2021/0288539 A1 | 9/2021 | Abdel-Khalik et al. |
| 2021/0327712 A1 | 10/2021 | Olsson |
| 2022/0231298 A1 | 7/2022 | Olsson |
| 2022/0302293 A1 | 9/2022 | Olsson |
| 2022/0393656 A1 | 12/2022 | Olsson |
| 2022/0396886 A1 | 12/2022 | Olsson |
| 2022/0399826 A1 | 12/2022 | Olsson |
| 2022/0416025 A1 | 12/2022 | Olsson |
| 2023/0119801 A1 | 4/2023 | Olsson |
| 2023/0146820 A1 | 5/2023 | Olsson |
| 2023/0261621 A1 | 8/2023 | Olsson |
| 2023/0327009 A1 | 10/2023 | Olsson |
| 2023/0352575 A1 | 11/2023 | Olsson |
| 2024/0186365 A1 | 6/2024 | Olsson |

FOREIGN PATENT DOCUMENTS

| | | | |
|---|---|---|---|
| CN | 105659383 A * | 6/2016 | ......... H01L 21/0242 |
| CN | 105914232 | 8/2016 | |
| CN | 105990443 | 10/2016 | |
| CN | 106549050 | 3/2017 | |
| CN | 110324568 | 10/2019 | |
| CN | 110336028 | 3/2021 | |
| EP | 1959530 | 8/2008 | |
| EP | 2075745 | 7/2009 | |
| EP | 2571065 | 3/2013 | |
| EP | 2816729 | 12/2014 | |
| EP | 284700 | 1/2015 | |
| EP | 2838125 | 2/2015 | |
| EP | 2955763 | 12/2015 | |
| GB | 2520687 | 6/2015 | |
| JP | 2003101069 | 4/2003 | |
| JP | 2008057383 | 3/2008 | |
| JP | 2010232423 | 10/2010 | |
| JP | 2014217252 | 11/2014 | |
| WO | WO 95/08452 | 3/1995 | |
| WO | WO 2010/100599 | 9/2010 | |
| WO | WO 2012/077513 | 6/2012 | |
| WO | WO 2012/105901 | 8/2012 | |
| WO | WO 2013/049817 | 4/2013 | |
| WO | WO 2017/111844 | 6/2017 | |
| WO | WO 2017/213644 | 12/2017 | |
| WO | WO 2019/202258 | 10/2019 | |
| WO | WO 2020/222149 | 11/2020 | |
| WO | WO 2021/021415 | 2/2021 | |

OTHER PUBLICATIONS

Asghar Asgari, "Negative Differential Capacitance of AlGaN/GaN Heterostructure in Presence of InN Quantum Dots", SPIE, PO Box 10 Bellingham WA 98227-0010 USA, Jan. 1, 2008.

Fujii et al., "Photoelectrochemical Properties of Ingan for H2 Generation From Aqueous Water", Japanese Journal of Applied Physics, Japan Society of Applied Physics, JP, vol. 44, No. 10, Oct. 11, 2005 (Oct. 11, 2005), pp. 7473-7435.

Nainani, "High-Performance III-V PMOSFET", May 2011, in 131 pages.

Naveed ul Hassan Alvi et al., "InN/InGaN Quantum Dot Photoelectrode: Efficient Hydrogen Generation by Water Splitting at Zero Voltage", Nano Energy, vol. 13, Mar. 6, 2015 (Mar. 6, 2015), pp. 291-297.

Sundaram et al, "Single-crystal nanopyramidal BGaN by nanoselective area growth on AlN/Si(111) and GaN templates"., Nanotechnology, vol. 27 (2016) 7 pages.

Tripathy et al., "AlGaN/GaN two-dimensional-electron gas heterostructures on 200 mm diameter Si(111)", Applied Physics Letters, 101, 082110 (2012) https://doi.org/10.1063/1.4746751 Submitted: Feb. 7, 2012, Accepted: Aug. 1, 2012, Published Online: Aug. 23, 2012.

Wang et al, Germanium-Assisted Direct Growth of Graphene on Arbitrart Dielectric Substrates for Heating Device, Nano Micro Small, vol. 13, No. Jul. 28, 26, 2017.

Anonymous, "High-electron-mobility transistor—Wikipedia", Mar. 6, 2020 (Mar. 6, 2020), XP055808423, Retrieved from the Internet: URL:https://en.wikipedia.org/w/index.php?title=High-electron-mobility transistor&old id=944233239, retrieved on May 27, 2021 6 pages.

Anonymous, "Phase-shift oscillator Wikipedia" Apr. 7, 2019 (Apr. 7, 2019), XP055793459, Retrieved from the Internet: URL:https://en.wikipedia.org/w/index.php?title=Phase-shift- oscillator&oldid=89138949 5, retrieved on Sep. 23, 2020 in 3 pages.

Cai et al, Monolithically Integrated Enhancement- and Depletion-Mode AlGaN/GaN HEMT for gaN Digital Integrated Circuits, vol. 53, No. 9, Sep. 1, 2006 (Sep. 1, 2006), pp. 2223-2230.

Chebrolu et al., "Recent progress in quantum dot sensitized solar cells: an inclusive review of photoanode, sensitizer, electrolyte, and the counter electrode", Journal of Materials Chemistry C 2019, pp. 4911-4933.

Dahal et al., "Realizing InGaN monolithic solar-photoelctrochemical cells for artificial photosynthesis", Appl. Phys, Lett. 104, 143901, (2014); Published Onlines: Apr. 9, 2014.

Doring et al., "Technology of GaN-Based Large Area CAVETs With Co-Integrated HEMTs," IEEE Transactions on Electron Devices, vol. 68, No. 11, Nov. 2021, pp. 5547-5552.

Eickhoff et al., "Piezoresistivity of Alx Ga1—xN layers and Alx Ga10xN/GaN heterostructures," Journal of Applied Physics, American Institute of Physics, vol. 90, No. 7, Oct. 1, 2001, pp. 3383-3386.

Enthaler et al, "Carbon dioxide and formic acid-the couple for environmental-friendly hydrogen storage?", Energy & Enviormental Science, 2010 pp. 1207-1217.

Faunce et al., "Nanotechnology, Plasma, Hydrogen from Artificial Photosynthesis, and Fuel Cells: Powering the Developing World to the Sustainocene", Nanotechnology Toward the Sustoinocene, Chapter 11, pp. 241-257.

Gust et al., "Solar Fukes via Artificial Photosynthesis", Department of Chemistry and Biochemestry and Center for Bioenergy and Photosynthesis, Arizona State University, Jul. 17, 2009, in 9 pages.

Iqbal et al. "Reactive Sputtering of Aluminum Nitride Thin Files for Piezoeletric Applications: A Review", Sensors, vol. 18, No. 6, Jun. 2018 in 21 pages.

Jones et al., "Review of Commercial GaN Power Devices and GaN-Based Converter Design Challenges," IEEE, vol. 4, No. 3, Sep. 2016, pp. 707-719.

Kampl et al., "2500 W full-bridge totem-pole power factor correction using CoolGaN," Nov. 5, 2018, pp. 1-46.

(56) References Cited

OTHER PUBLICATIONS

Kozodoy et al. "Polarization-enhanced Mg doping of AlGaN/GaN superlattices," Applied Physics Letters, vol. 75, No. 16, Oct. 18, 1999, pp. 2444-2446.
Krishna et al. "AlGaN/GaN Superlattice-Based p-Type Field-Effect Transistor with Tetramethylammoninum Hydoxide Treatment," Physica Status Solidi, vol. 217, No. 7, Apr. 1, 2020 in 8 pages.
Kumar et al. "Quantum dot activated indium gallium nitride on silicon as photoanode for solar hydrogen generation", Communcations Chemestry, in 7 pages.
Lin et al., "Physical and electrical characteristics of AlGaN/GaN metal-oxide-semiconductor high-electron-mobility transistors with rare earth Er2O3 as a gate dielectric", Thin Solid Films, vol. 544, Oct. 2013 (Oct. 2013), pp. 526-529.
Lu et al., "Paralleling GaN E-HEMTs in 10kW-100kW systems," 2017 IEEE Applied Power Electronics Conference and Exposition, Mar. 26, 2017, pp. 3049-3056.
Matioli et al. "Room-Temperature Ballistic Transport in III-Nitride Heterostructures," ResearchGate, https://www.researchgate.net/publication/271329249_Room-Temperature_Ballistic_Transport_in_III-Nitride_Heterostructures/link/57d9301d08ae6399a39acce3/download?_tp=eyJjb250ZXh0Ijp7lmZpcnN0UGFnZSI6lnB1Ymxp Y2F0aW9uIiwicGFnZSI6lnB1YmxpY2F0aW9uIn19, Jan. 2015, in 10 pages.
Mitsunari et al., "Single-crystalline semipolar GaN on Si(001) using a directional supttered AlN intermediate layer", Journal of Crystal Growth, 2015 in 4 pages.
Mukhopadhyay, P. "Comparative DC Characteristic Analysis of AlGaN/GaN HEMTs Grown on Si(111) and Sapphire Substrates by MBE" Jour. of Elec. Mat. vol. 43, No. 4, Feb. 14, 2014 pp. 1263-1270 (Year: 2014).
Park, J. "Comparison of AlGaN/GaN High Electron Mobility Transistor with AlN or GaN as a cap layer" Conference paper proceedings on Research Gate available online at address recited in the Office Action as of Jul. 14, 2015 pp. 1-2 (Year: 2015).
Raj et al. "Demonstration of a GaN/AlGaN Superlattice-Based p-Channel FinFET With High ON-current," IEEE Electron Device Letters, vol. 41, No. 2, Dec. 31, 2019, pp. 220-223.
Ramakrishna et al. "Nitrogen doped CNTs supported Palladium electrocatalyst for hydrogen evolution reaction in PEM water electrolyser", International Journal of Hydrogen Energy, 2016 pp. 20447-20454.
Seo et al., "i-based nonalloyed Ohmic contacts for Al0.15Ga0.85N/GaN high electron mobility transistors using regrown n+-GaN by plasma assisted molecular beam epitaxy," Applied Physics Letters, vol. 93, Issue 10, Sep. 8, 2008, pp. 102102-102102.
Shibata, D. "1. 7 kV/ 1.0 mQcm2 Normally-off Vertical GaN Transistor on GaN substrate with Regrown p-GaN/AlGaN/GaN SemipolarGate Structure" IEEE Int. Elec. Dev. Meet. IEDM 2016, Feb. 2, 2017 pp. 248-251 (Year: 2016).
Shrestha et al. "Optimal design 5,9 of the multiple-apertures-GaN-based vertical HEMTs with SiO2 current blocking layer", Journal of Computational Electronics, Springer us, Boston, vol. 15, No. 1. Aug. 7, 2015 (Aug. 7, 2015pp. 154-162.
Sritoma et al., IIA Novel GaN-Hemt based Inverter and Cascade Amplifier 11 , 2018 IEEE Electron Devices Kolkata Conference (EDKCON), IEEE, Nov. 24, 2018 (Nov. 24, 2018), pp. 465-469.
Tavares et al., "Implementation of a high frequency PWM signal in FPGA for GaN power devices switching", 2017 Brazilian Power Electronics Conference (COBEP), IEEE, Nov. 19, 2017 (Nov. 19, 2017), pp. 1-7.
Zhang et al., "Conducted noise reduction of totem-pole bridgeless PFC converter using GaN HEMTs," 2015 IEEE International Telecommunications Energy Conference, Oct. 18, 2015, pp. 1-5.
Lan et al., "Efficienty improvement of the Light-emitting diodes by the lateral overgrowth GaN on an AlN nanorod template," 14th International Conference on Solid State Lighting and LED-based Illumination Systems 957100 SPIE, Sep. 8, 205 in 7 pages.

* cited by examiner

REINFORCED THIN-FILM DEVICE

INCORPORATION BY REFERENCE TO ANY PRIORITY APPLICATIONS

Any and all applications for which a foreign or domestic priority claim is identified in the Application Data Sheet as filed with the present application are hereby incorporated by reference under 37 CFR 1.57.

TECHNICAL FIELD

The present invention pertains in general to surface treatments of silicon wafers and to devices for heterogeneous integration of III-V materials onto silicon.

BACKGROUND OF THE INVENTION

According to Moore's law, the number of transistors that can be fit on a chip is expected to increase exponentially where the rate of doubling the number of transistors is every 24 months. However, this leads to problems when the electronics is scaled down to the nanoscale. The downscaling of the electronics has continued since the early 1970s. Through the transistor miniturization, the performance per cost ratio has increased, which has led to exponential growth of the semiconductor market. This has also led to continued investments in semiconductor technology, which has driven further miniturization of the electronics. The semiconductor industry is now facing a challenge to replace silicon-based CMOS in order for the increasing performance to continue. The reduction of the silicon transistors will reach its limit. A unique feature of silicon-based field effect transistors (MOSFET) has been that their performance improves as its dimensions are reduced. Because field effect transistors have decreased in size by developing process methodology, performance has increased exponentially with transistor density. Modern logic circuits are based on transistors with complementary properties. They are referred to as n-type and p-type MOSFET (or simply NMOS and PMOS transistors). The principle of miniaturization is that the electrodes as well as the n-channel and the p-channel length are shorter and shorter. Together, PMOS and NMOS transistors are used for CMOS circuits, which have made it possible to manufacture the very dense integrated circuits of today so far.

Recently, the MOSFET scaling is in a phase of power-limited scaling as the heat dissipated is about 100 W/cm2. The power density cannot increase much more without extensive packaging and cooling costs that make these chips impractical for most applications. It is mainly silicon's ability to form a native oxide that has made it particularly useful in integrated circuits, but high permittivity oxides are evaluated for compound semiconductors. In particular, it is thus a geometric shrinkage of CMOS transistors that enabled today's computers. In order to continue the electronics development, new solutions are needed to implement new types of semiconductor materials on cheap silicon wafers.

Attention is turned to a family of materials that are suitable for increasing the performance of CMOS transistors, the so-called Group III-V semiconductor. These semiconductors are combined from elements of group III and group V in the periodic table of elements and are attractive semiconductor materials for their many times better electronic properties than silicon. The semiconductor materials germanium and graphene are also attractive as alternative materials for the production of electronic components. The outstanding electronic transport properties of these materials can be absolutely central to the development of nanoelectronics. III-V semiconductors such as GaAs, InAs, InP and their ternary and quaternary alloys combine elements in columns III and V of the periodic table. Such materials must be made on a silicon platform very similar to Si-CMOS for a competitive III-V CMOS technology, which necessitates the co-integration of III-V semiconductors with germanium or separate III-V semiconductors on silicon. However, the production of high quality channel materials on silicon substrates is very challenging, especially for III-V semiconductors. The main candidate for future CMOS is today III-V CMOS technology to continue manufacturing of integrated circuits. Its future role for future CMOS technologies is described in the International Technology Roadmap for Semiconductors (ITRS). It is generally expected that around the 10-14 nm node, alternative channel material will be needed to achieve the performance targets set forth in the International Technology Roadmap for Semiconductors (ITRS).

However, the possibility of combining III-V materials as alloys is primarily of interest due to their properties being epitaxially grown in different heterostructures with different bandgaps for electronics with gas phase chemical processes. The III-V material can be epitaxially produced by gas phase deposition from III-element and V-element thermally degraded precursor molecules. However, the materials cannot grow on just any surface but must have a crystalline surface of a material with the same or similar lattice constant to achieve high crystalline quality. Heterostructures in AlGaInAs alloy are e.g. InGaAs/GaAs/InGaAs and GaN/InGaN/GaN structures forms quantum wells, respectively, allowing recombination of charge carriers (electrons and holes) for photonic components. III-V semiconductors are therefore of great interest for photonic applications such as lasers and LEDs, but also because of the direct bandgap of the III-V materials. These semiconductor materials are also of interest in manufacturing semiconductor components due to their very high mobility of high frequency electronics, ballistic electron transport in one-dimensional nanostructures, trapping of charge carriers in 0 and 1-dimensional nanostructures in quantum electronics, respectively. Some III-V semiconductors have very high mobility for negative charge carriers e.g. indium antimony and other semiconductors e.g. germanium has very high mobility for positive charge carriers. III-V semiconductor materials enable photonic applications that could be integrated on a silicon wafer. The electron mobility of graphene is 200,000 cm2 V-1 s-1, for silicon about 1400 cm2 V-1 s-1 and for indium antimonide about 77,000 cm2 V-is-1. Graphene's superior electron mobility, but poor hole mobility is therefore not suitable for CMOS electronics. For CMOS electronics, high electron mobility is not enough, but for electron mobility germanium with 1900 cm2 V-1 s-1 is followed by InSb with 850 cm2 V-1 s-1 which has the greatest mobility for positive charge carriers for p- and n-doped channel materials. One of the most important problems to overcome for realizing III-V CMOS is therefore a heterogeneous integration on a silicon platform.

In order for III-V compound semiconductors to be an alternative technology as a semiconductor for integrated circuits, it requires corresponding drivers as Si CMOS. The process flow for III-V MOSFETs requires to use a similar process flow as for a silicon based CMOS technology. In addition, different III-V semiconductors needs to be co-integrated for industrially usable wafers with diameters of 8-12". Previously, single III-V compound semiconductors have been demonstrated on silicon. Thin buffer layers less than 400 nm would be required for a commercial co-integration even if thick buffer layers have been used to demo components.

The document, "J. A. del Alamo et al., III-V CMOS: the key to sub-10 nm electronics?, Microsystems Technology Laboratories, MIT, 2011 MRS Spring Meeting and Exhibition Symposium P: Interface Engineering for Post-CMOS Emerging Channel Materials" describes that the power density for CMOS is saturated at ~100 W/cm2. The clock frequency is saturated at 4 GHz. The document further describes the challenge to co-integrate III-V heterostructures on large wafer areas such as silicon wafers with thin buffer layers and low defect density. In particular, the document describes the problem with co-integration of two different thin-film structures islands side-by-side. One of the critical factors for this is that the materials have very different lattice constants.

The document "J. A. del Alamo et al., The prospects for 10 nm III-V CMOS, Microsystems Technology Laboratories, MIT, Rm. 39-567, Cambridge, MA 02139, USA" describes that dependent on the candidate material for the p-channel it is a challenge in itself that two different materials need to be integrated side-by-side very closely on a silicon wafer.

A problem that the document, "International Technology Roadmap for Semiconductors 2009 Edition Emerging Research Materials" describes is to use other semiconductors than silicon as the III-V semiconductor that have low electron mobility, but have low hole mobility. Germanium has a high hole mobility, but the electron mobility is not as high as for III-V compound semiconductors. Another problem is that to realize a high mobility n- and p-channel for transistors with different channel materials co-integrated to utilize the high respective charge carrier mobilities. Another problem is selective growth of alternative transistor channel materials at desirable locations with controllable locations and directions on a silicon wafer.

The document, "International Technology Roadmap for Semiconductors 2011 Edition Emerging Research Materials" describes the challenges year 2011 projected for year 2018-2026. Of special interest is to invent a new CMOS technology that can replace conventional CMOS technology. According to Moore's law and ITRS the transistors have been expected to shrink to 10 nm year 2017, 7 nm year 2019, 5 nm year 2020 and 3 nm year 2023. In particular, the document describes the problem of co-integrating III-V semiconductors with germanium for CMOS as challenging, but even if integrated, the challenges will be even more complex by also requiring defect control and doping control. Furthermore, doping activation of III-V materials can occur at low temperatures while activation of dopant atoms for germanium requires high process temperatures for n-doping. These two competing requirements may require that germanium components be produced before the growth of III-V materials, which increases the integration complexity of III-V material and germanium even more.

In particular, the document describes the problem of co-integrating III-V semiconductors with germanium for CMOS as challenging, but even if integrated, the challenges will be even more complex by also requiring defect control and doping control. Furthermore, doping activation of III-V material can occur at low temperatures while activation of dopant atoms for germanium requires high process temperatures for n-doping. These two competing requirements may require that germanium components be produced before the growth of III-V material, which increases the integration complexity of III-V material and germanium even more.

The doctoral thesis "High-Performance III-V PMOSFET, A. Nainani, 2011" describes that since the miniaturisation of silicon-CMOS technology yields marginal returns, III-V materials have been explored for a long time for use as the transistor channels for high-performance transistor components at low voltage. The document describes that the greatest challenge for III-V field effect transistors for post-silicon CMOS is the heterogeneous integration of III-V materials with a silicon platform. Another challenge is to integrate p-type components with germanium as the p-type MOSFET channel with an n-type III-V based MOSFET.

The document "J. A. Del Alamo et al., "Nanometre-scale electronics with III-V compound semiconductors." Nature 479.7373 (2011): 317-323." describes that the largest challenge for post-SiCMOS is to prepare the substrate so that NMOS and PMOS transistors can be manufactured side-by-side. The document in particular describes that a problem that must be solved in order to realize the III-V CMOS is to integrate NMOS and PMOS transistors on silicon. Above all, possibly the greatest progress required is for side-by-side integration of III-V NMOS and PMOS transistors on a silicon substrate. The technology budget dictates the use of silicon wafers primarily to achieve the cost structure of Moore's law. The buffer layers need to be thin for economical reasons with short epitaxial growth times, but also because of thermal reasons for dissipating heat. The growth rate of epilayers of III-V semiconductors and their alloys is about 1-2 µm/h. Buffer layers for III-V semiconductors on silicon is about 1.5 µm thick. The largest challenge for III-V CMOS is to manufacture a hybrid substrate for NMOS and PMOS transistors with islands of two separate materials with different lattice constants placed side-by-side providing a flat surface. The document states that this is a critical problem that is not given enough attention.

To produce cheaper gallium nitride substrates, buffer layers have been produced so far on silicon, where a thin-film is grown with an alloy with a gradient of semiconductor material from aluminum nitride to gallium nitride. That is, in order to make electrical components in gallium nitride materials, particularly planar LEDs by forming planar GaN/InGaN/GaN quantum wells with a 2-dimensional electron gas defined by the thin layer of InGaN which is usually 1-5 nm thin. The lattice constant for III-V semiconductors makes it difficult to manufacture thin-films of III-V material on silicon without cracking during manufacture on larger wafers.

A further development of silicon-CMOS technology is so-called silicon FinFET technology using an anisotropically etched silicon semiconductor with a multi-gate contact between the source and drain. The difficulty of planar CMOS scaling is to maintain an acceptable gate control of the current through the transistors. FinCMOSFET has the advantage that it is very easy to coat horizontal elongated structures with contacts with advantageous electrostatic control of the current through the transistor. One problem with FinFET, however, is the high resistance that arises from the narrow semiconductors. Furthermore, FinFET technology is limited by top-down process methodology for transistor nodes below 10 nm.

Apart from their very good electronic properties, materials such as III-V semiconductors and graphene have been difficult to manufacture on large silicon wafers. For III-V semiconductors, this is due in particular to the fact that these semiconductors are lattice-mismatched semiconductors, i.e. their lattice constant in the crystalline lattice of atoms differs significantly from silicon. This results in the formation of stress in the silicon wafer which result in curvature and a microscopic bending of the silicon wafer. Coating pure gallium nitride (lattice-mismatched semiconductor) on silicon easily leads to a cracked silicon wafer. A method described above for coating silicon with gallium nitride is to grow buffer layers in a complicated process of coating a silicon wafer with a large number of alloys of aluminum gallium nitride which even out stresses in the buffer layer with various doping and aluminum gallium nitride alloys. This process is difficult to scale to large and various volumes of silicon wafers and in particular it needs to be optimized per equipment and silicon wafer. Furthermore, the large number of alloys epilayers in aluminum gallium nitride leads to a long process time, which is very costly for large scale production.

LED manufacturers grows III-nitride semiconductor on sapphire substrates, which is very expensive, about $400 for a 6-inch wafer, and the silicon electronics manufacturer faces an upcoming challenge of switching to III-V material for performance enhancement for integrated circuits, which today would require semiconductor wafers of 200-300 microns thick solid III-V semiconductor. For larger discs than 2" III-V semiconductors that will be needed in the semiconductor industry according to the international roadmap for semiconductor technology (ITRS), there is currently no readily available product.

One way to alleviate with the aforementioned problems is to use lateral overgrowth of III-V material. Such a solution is described, inter alia in patent US20100072513 A1, wherein semiconductor material is coated on a crystalline substrate with a first semiconductor material and a mask disposed over a surface of the crystalline substrate. The semiconductor material comprises crystalline overgrowth of a second semiconductor material with filling openings and covering the mask to reduce dislocations. The disadvantage of such a solution is that III-V material is so brittle that two different lattice-mismatched semiconductor materials or III-V material and germanium or other combinations of materials with different lattice constant on the same crystalline substrate will cause the wafer to crack, and especially for larger wafer diameters such as 4-12 inches.

The document U.S. Pat. No. 7,250,359B2 describes how tension is introduced in the wafer when integrating germanium on silicon. The document further discloses a method of growing III-V material on silicon by etching V-shaped indentations in silicon followed by epitaxial lattice-mismatched growth of III-V material on silicon. The aim is that the size of GaN substrate is limited due to stresses in the materials. The thickness of the GaN film can also provide wavelength shifts for light emitted from GaN-based optical components. Cracking usually occurs in GaN epilayers with stresses and strains in the crystal structure. The disadvantage of this method is that the lattice mismatch causes a lot of stresses to remain in the material, which consequently leads to limitations on the size of epitaxial substrates intended for lattice mismatched semiconductors.

The document U.S. Pat. No. 9,379,204B2 describes how wafers in III-V materials are etched and refilled with III-V material to provide dislocation-free III-V semiconductors. The downside to this method is that the lattice mismatch creates lots of tension in the material to remain. Furthermore, the mechanical performance of the wafer is not sufficient for the purpose of co-integrating very diverse III-V materials which provide different stresses on the wafer over large areas greater than 2 inches.

One way of forming FinFET components with associated III-V material on a silicon substrate is described in document US20140264607A1. According to this solution, non-silicon-based semiconductors are grown in grooves with a length-thickness ratio to form semiconductor material in the grooves lattice mismatched. It is also described how different parts of semiconductor fins can be doped to form source and drain contacts with the semiconductor fins. The disadvantage of this method is that the brittleness of the wafer remains as the semiconductor fins grow lattice-mismatched on a silicon substrate. One major problem is that the lattice constant for III-V semiconductors makes it difficult to manufacture thin-films of III-V material on silicon without cracking during manufacturing on larger wafer substrates. In particular, dislocations can propagate to the semiconductor fins.

The document Wang et al., Small, 13, 2017, 1700929, describes how a germanium epilayer can be used catalytically to synthesize graphene with CVD. A 200 nm thick germanium film was sputtered onto high-doped p-Si wafers with 300 nm SiOx oxide layer. In particular, it is desirable to form graphene to avoid metal contamination. Under vacuum, a mixture of hydrogen 23 sccm and argon 230 sccm was introduced up to atmospheric pressure. Without changing the gas flows, the germanium epilayer was heated to near its melting point of 900-930 degrees Celsius. Methane gas 0.7 sccm was added to the reactor for 60-360 min. The disadvantage of this method for producing germanium layers for catalyzing graphene growth is that the germanium layer is sputtered and of low crystalline quality for quantum electronic components with graphene.

In summary, there are problems with the known methods of manufacturing III-V material and other materials on silicon. One problem is that the defects of III-V thin-films on silicon wafers larger than 6" with known buffer layer technology prevents the production of thin-film buffer layers that are 50-100 nm thin on III-V semiconductors on silicon for electronic components.

Another problem is that thick III-V thin-films on silicon, which can improve the crystal quality to a limited extent, leads to other problems in photonics with wavelength shifts due to thick buffer layers on silicon and inferior heat dissipation due to the power density of III-V CMOS, which would then be remedied with thinner epilayers with III-V semiconductors on silicon.

SUMMARY OF THE INVENTION

Accordingly, embodiments of the present invention preferably seek to mitigate, alleviate or eliminate one or more deficiencies, disadvantages or issues in the art, such as the above-identified, singly or in any combination by providing a reinforced thin-film according to the appended patent claims.

It should be emphasized that the term "comprises/comprising" when used in this specification is taken to specify the presence of stated features, integers, steps or components but does not preclude the presence or addition of one or more other features, integers, steps, components or groups thereof.

The object of the invention is to provide reinforced wafers which have higher crystalline quality for epitaxial growth than what is currently possible to manufacture with a size above 4 inches in massive high-mobility semiconductor material with previous methodology or with buffer layers for electronic components.

A further object of the invention is to provide a silicon wafer which does not crack due to growth of III-V semiconductor material which causes the current silicon wafers to bow. For industrial application it is also required that the wafers are compatible with robot handling, such that a robot arm (which goes under the wafer with a vacuum suction) can transfer the wafers in and out of a process chamber as in use in equipment for 6-12" wafers. This would make it cheaper to manufacture high performance electronic components based solely on the higher mobility of charge carriers than in silicon, while silicon wafers can be used as a platform in a number of processes designed for specific dimensions for industrial scale wafers such as 2 inch, 4 inch, 6 inch, 8 inch and 12 inch wafers. It would also allow for a very high precision in epitaxial manufacturing of integrated circuits for post-silicon CMOS components as well as integrated nanoelectronics and photonics on silicon wafers.

Another object of the invention is to provide a wafer as a means of constructing a quantum computing device on a silicon wafer herein described.

The above described objects are achieved by means of the thin-film device according to the attached independent claims, wherein specific embodiments are described in the dependent claims. The invention thus aims to provide a thin-film of higher strength which can replace massive III-V semiconductor wafers and thereby enable the growth of III-V semiconductor epilayers (or graphene) on silicon with control to make functional electrical components.

Another object of the invention is to integrate various high-mobility semiconductors on a silicon platform for post-silicon CMOS components. Such a co-integration is considered extremely challenging in the literature and is considered as the major challenge for III-V CMOS. Another object of the invention is to provide a means for positioning epitaxial layers as islands of different semiconductor materials side-by-side on a wafer and controlling their size for the VLSI III-V CMOS. Co-integration of islands of two different semiconductor materials with different lattice constants on silicon wafers, is necessary for III-V CMOS to achieve the goals set forth in the International Technology Roadmap for Semiconductors (ITRS). Furthermore, an object of the invention is to provide a means for post-silicon CMOS nanoelectronics platform for the transistor nodes below 10 nm and thereafter which becomes challenging to manufacture with top-down process methodology for quantum computers.

A first aspect of the invention is a reinforced thin-film device comprising a substrate having a top surface for supporting an epilayer, a mask layer patterned with a plurality of nanosize cavities disposed on said substrate to form a needle pad, a thin-film of lattice-mismatched semiconductor disposed on said mask layer, wherein said thin-film comprises a plurality of in parallel spaced semiconductor needles of said lattice-mismatched semiconductor embedded in said thin-film, wherein said plurality of semiconductor needles are substantially vertically disposed in the axial direction toward said substrate in said plurality of nanosize cavities of said mask layer, and wherein a lattice-mismatched semiconductor epilayer is provided on said thin-film supported thereby; preferably wherein said substrate is a silicon wafer greater than 2 inches in diameter. Further embodiments of the invention are defined in the dependent claims, wherein features for the second and subsequent aspects of the invention are as for the first aspect mutatis mutandis.

In brief terms, the reinforcement provided by the thin-film is a vertical reinforcement with semiconductor needles embedded in the thin-film. Semiconductor needles of III-V material with diameters of 5-10 nm have very good strength properties compared to bulk semiconductor material. The reinforcement hence allows for elastic deformation of such semiconductor needles to prevent dislocation propagation. In addition, the pattern of how the needles are embedded in the thin-film with a close-packed structure is used for reinforcement.

A first advantage of the reinforced thin-film device is that most of the III-V semiconductor growth of semiconductor needles on silicon grows at up to 30 μm/h compared to 1 μm/h for conventional thick buffer layers on silicon. The short cultivation times for nanowires reduce the overall growth time dramatically for a thin-film of III-V semiconductor and allow a thin-film below 100 nm with higher crystal quality than a micrometer thick buffer layer.

A further advantage is that the reinforced thin-film device enables wafers of III-V semiconductors which are 6-12 inches in diameter without dislocations being propagated due to lattice strain. Dislocation propagation is limited by a tightly packed reinforcement on the nanoscale, which prevents cracking i.e. that the silicon wafer can break into several pieces. Also, for homoepitaxial crystal growth of two different high-mobility p-type and n-type channels, the crystal quality of transistor channels increases by fewer dislocations that can propagate due to the embedded densely packed nanowires in the thin-film.

Another advantage is that thin-films can be grown on silicon substrates with a height on the order of a billionth of a meter, which can replace solid 250-1000 μm thick massive wafers of the same material. III-V semiconductor wafers used today, by III and V precursors that are limited in abundance to replace silicon which is a very abundant element that can be extracted from sand compared to III and V precursors that are relatively rare.

Another advantage is that the thin-film does not need to be grown by heteroepitaxial growth, or on a substrate of proper crystal direction such as (111) plane silicon wafer.

Another advantage is that contamination of a MOCVD chamber for GaN growth with aluminium may not be required.

Another advantage is that the reinforced thin-film device enables the growth of graphene islands on germanium-on-silicon substrates i.e. with graphene as the material with the highest electron mobility of a semiconductor material so far.

Another advantage is that the heat produced in CMOS transistors can be effectively dissipated through the thin epilayer of the thin-film device.

Another advantage is that due to the control of positioning of nanowires at specific positions on a silicon wafer, islands of different III-V and germanium layers can be grown side-by-side for planar NMOS and PMOS transistors on a reinforced wafer.

Another advantage is that activation of dopant atoms for germanium islands can be done prior to growth of III-V islands.

Another advantage is that the positions of epitaxial islands and their growth can be controlled for VLSI III-V/III-V fin CMOS TFET.

Another advantage is that thin intrinsic epilayers can be defined for p-i-n tunnel effect transistors for PMOS and NMOS on a reinforced wafer. This means that scaling of III-V finFETs could be used for the nodes below 7 nm.

Another advantage is that indium antimony epilayers can be made on silicon wafers to produce epitaxially grown nanostructures for topological quantum computers on silicon wafers.

BRIEF DESCRIPTION OF THE DRAWINGS

The invention, together with its further objects, advantages, embodiments and features, may best be understood by reference to the following description and the accompanying drawings. Reference is made to the enclosed patent drawings, in which.

DETAILED DESCRIPTION OF THE DRAWINGS

Figure 1:
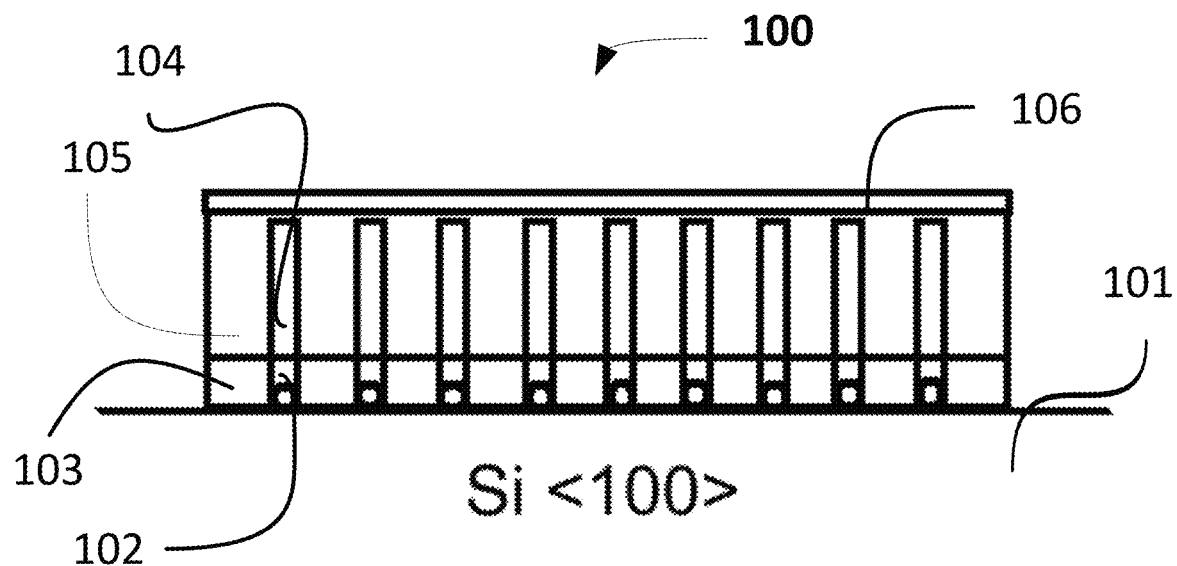
FIG. 1 describes the reinforced thin-film device 100.

In the drawings, similar or corresponding features are indicated by the same reference number. Before describing the invention in detail herein, it is to be understood that the invention is not limited to any specific substrates or specific embodiment of an epilayer. The invention is not limited to any embodiment of any 3-dimensional embodiment of channel material for transistors unless such spatial limitations are indicated. The invention is not limited to any particular epitaxially grown semiconductor. For the purpose of this specification, "lattice-mismatched" and "non-lattice matched" refer to a semiconductor which is intentionally substantially mismatched in lattice constant to a substrate designated for semiconductor material growth. In the following, "thin-film" should be interpreted as an epitaxially grown semiconductor layer of a thickness below 100 nm. Also for the purpose of this specification, "III-V nanoparticles" refer to nanoparticles of the InAlGaN material system or nanoparticles of the InGaAsP material system, and 'mask layer' shall mean such a layer that is used to prevent deposition of semiconductors epitaxially on a substrate. A "nanotree" refer to such a tree that is a branched nanostructure. Also, a "semiconductor needle", "nanoneedle" and "nanosize needle" can be used interchangeably and refer to an elongated semiconductor structure with a radius less than 100 nm. For example, the III-V semiconductor gallium arsenide is a lattice-mismatched semiconductor for growing gallium arsenide on silicon wafers i.e. gallium arsenide cannot simply grow on silicon wafers without introducing stresses into the crystal structure. It is also to be understood that the terminology used herein is for the purpose of describing only specific embodiments, without any intention of limitation. In addition, for the purpose of this description, the use of the singular forms "one" and "the" refers to also including plural forms if it is not stated otherwise from the context.

The present description illustrates the principles of the present disclosure. It will thus be appreciated that those skilled in the art will be able to devise various arrangements that, although not explicitly described or shown herein, embody the principles of the disclosure and are included within its scope.

FIG. 1 describes the reinforced thin-film device 100 in an embodiment comprising a silicon wafer 101 having a top surface to support an epilayer. A mask layer 103 is patterned with a plurality of nanostructures 102' disposed on the silicon wafer 101. A thin-film of lattice-mismatched semiconductor 105 is provided on the mask layer 103 where the thin-film 105 has embedded nanowires. Nanowires are vertically and in parallel arranged in the axial direction to the substrate in the nanosize cavities 102 of the mask layer. A plurality of nanosize holes may be configured in the mask with a hole diameter of 1-80 nm to provide the semiconductor needles 104 of the same thickness in the nanosize holes. The nanosize holes 102 may be deep holes to grow the nanowires in the C-direction for wurtzite crystal structure. The nanowires can also be p-doped to be arranged in the C-direction for wurtzite. The mask layer forms a needle pad with free-standing nanowires of the same semiconductor material as the epilayer. It is preferred that the silicon wafer 101 is greater than 2 inches in diameter.

In the following, embodiments and particular embodiments relating to FIG. 1 will be described. The thin-film 105 is made reinforced with nanowires 104 by semiconductor growth from semiconductor crystals incorporated into nanosize holes 102 in a mask layer 103. The mask layer 103 both prevents crystal growth on the substrate, but also acts as a semiconductor particle holder. Nanowires 104 abut the passivated layer 103 used to direct the nanowire direction relative to the flat surface of the silicon wafer. A lateral overgrowth of the nanowires 104 may be 100-200 nm thickness of thin-film 105. Semiconductor crystals may be designed as III-V semiconductors, but GaN semiconductor crystals may also be used.

According to the invention, nanowires 104 are nucleated from semiconductor nanoparticles in the C-direction of the crystal structure. Nanowires 104 can therefore be obtained with an upper side of the C-plane for wurtzite with M-plane faces along its length. The length of the wurtzite nanowire segment may be e.g. 10-50 nm and a distance between the nanowires can be e.g. 100-300 nm. According to the invention, nanowires 104 are nucleated from semiconductor nanoparticles in the C-direction of the crystal structure. Nanowires 104 can therefore be obtained with the top as the C-plane for wurtzite with M-plane side faces along its length. The length of the wurtzite nanowire segment may be 10-50 nm and a distance between the nanowires can be e.g. 100-300 nm. On top of the wurtzite nanowire segments, zinc blende nanowires are grown with an abrupt change in the crystal structure of zinc blend with a change from hexagonal close-packing of atoms of the <0001> crystal plane to cubic close-packing of <111> planes of zinc blende. High p-doping of nanowires can be used to facilitate the transition from natural zinc blende crystal structure to wurtzite and the smaller width of the nanowires may also contribute to such a transition. On top of zinc blende nanowires, a 2D layer of semiconductor is grown. Wurtzite segments of nanowires can be grown at a low pressure (100 mbar). The synthesis of GaN can be written as $Ga+NH_3 = GaN+3/2 H_2$. It is preferred to use a process to grow III-N nanowires from GaN nanoparticles with the process conditions: (TMG)=[10.20] sccm, (NH3)=[10.20] sccm, P=[100, 150] mbar, T=[1000.1100] C. On a thin-film in gallium nitride, epilayers of p-doped GaN can be grown with the following process conditions (TMG)=[400,500] sccm, Mg3N2)=[100,250] sccm (NH3)=[900,100] sccm, P=[100,250] mbar, T=[800, 1000] C, InGaN can be growth with the process conditions (TEG)=[80,110] sccm, (TMIn)=[600,700] sccm, NH3)= [900,1100] sccm, P=[100,250] mbar, T=[800,900] C and n-doped GaN can be grown with the following process conditions (TMG)=[400,500] sccm, (NH3)=[900, 1100] sccm, P=[100,250] mbar, T=[800, 1000] C. The nucleation of wurtzite nanowire 104' can be induced by a mole fraction of a p-dopant element to an epitaxial process gas flow. It is preferred to grow the reinforced thin-film with the process conditions: (TMG)=[400, 500] sccm, (NH3)=[900, 1100] sccm, P=[100, 250] mbar, T=[800, 1000] C.

Nanowires of indium phosphide can be grown on a silicon wafer using gold-particle assisted growth. The gold may be sputtered on the wafer and lithographically patterned for wet etch of gold. After nanowire growth the remaining gold can be removed by wet etching. The nanowire growth occurs by providing vapor of these elements reacting at a crystal surface where the reaction can be summarized as follows: $In(CH3)3 (g)+PH3 (g)=InP (s)+3CH4 (g)$. For InP nanowire growth the precursors trimethylindium (TMI), phosphine (PH3), DMZn, and TESn can be used. The total process gas flow can be 13.0 liters per minute of hydrogen gas as the carrier gas. The mole fraction of DMZn may be configured for p-doping in order to grow the nanowires with wurtzite crystal structure. The reactor temperature for III-V nanowire growth may be 420° C., where the growth is initiated by addition of TMIn and for doped samples corresponding to DMZn as dopant to the reactor. On top of the InP nanowires are another compound semiconductor grown by lateral overgrowth to provide the InP nanowires as a needle pad in the thin-film. The reaction for growth of InAs can be written as $In(CH3)3 (g)+As3 (g)=InAs (s)+3CH4 (g)$.

It is preferred that the elongated semiconductor crystals have segments of nanowires 104 with wurtzite crystal structure. The challenge of growing different semiconductor nanowires on silicon substrates is a major challenge due to the difference in lattice constant, but also the necessity of proper crystal orientation for the substrate for III-V nanowire growth of zinc blende crystal structure in the <111>B direction. Wurtzite crystal structure for non-nitride semiconductors has not been possible with bulk growth of semiconductor, but is possible through nanowire growth. Because of the polar nature of wurtzite crystals, the nanowires can grow in the <111> direction of zinc blende by a stacking error from the crystal structure wurtzite. The nanowires are laterally overgrown with a thin-film which is bulk zinc blende for e.g. gallium arsenide or wurtzite for gallium nitride where the nanowires form a reinforcement embedded in the thin-film, preventing cracking and propagation of dislocations.

The nanosize holes 102, which are also holders of the nanoparticles, may be formed in a range of 5-20 nm for growth of the wurtzite crystal structure nano-needles. In-situ p-doping of the nanowires 104 can also be used to nucleate wurtzite crystal structure for III-V semiconductor nanowires. The growth of nanowires 104 is described by the vapor-liquid-solid (VLS) model and the vapor-solid-solid (VSS) model. The energy barrier for 2D nucleation decreases during doping, making it possible to nucleate nanowires at much smaller nanoparticle radius than for non-p-doped nanowires 104. Thus, an advantage of p-doping semiconductor cores is that the nanowires are nucleated at much less radius of the semiconductor particles. As the radius of the nanoparticle decreases, the driving force for nucleation increases with a low energy barrier similar to the energy barrier for a transition state for a chemical reaction. The nanowire length depends on the integrated growth rate over time.

According to the invention, semiconductor particles of different semiconductor materials can be disposed on a nanoscale area 102 in silicon nitride 103 on a silicon wafer. When process gases are turned on for growth of the respective semiconductors on the semiconductor particles, nanowires grow in the nanosize holes where the diameters of the nanowires 104 are defined by the diameter of the nanosize holes 102. The advantage of this process is that because the growth is lattice-adapted, it does not require any catalyst particles to grow the nanowires on e.g. a silicon substrate, which also prevents Ostwald ripening (Ostwald ripening), which normally leads to different lengths of the nanowires. Since the growth is lattice-matched, dislocations are limited to the initial growth and the quality of the semiconductor crystal is refined as the nanowire's crystal quality increases by a growth rate of about 50 μm/h (0.8 nm/min) when these are grown from the nanosize holes.

It is preferred that the nanowires be grown on the nanoscale with organometallic gas phase epitaxy (MOVPE) which is the present commercial method of growing nanowires. The crystal growth according to the invention occurs by providing the vapor of these elements reacting at the crystal surface of a semiconductor nanoparticle in a nanosize hole. The basic substance flow of V-gas can be in the range of 10-30 sccm when growing nanowires.

The epilayer may be made in C-plane gallium nitride for the growth of dislocation-free gallium nitride on silicon wafer, (110)-plane germanium for the growth of graphene on silicon wafer or consist of islands of (110)-plane germanium and III-V semiconductor. The reinforcement of thin-films with nanowires vertically arranged in the epilayer enables much higher crystalline quality for large semiconductor wafers (4-12 inch diameter) than solid semiconductor wafer or buffer layer on silicon due to the material strength properties of the nano-needles. It is preferred that the nano-needles are made by a process of growing lattice-matched semiconductors from nanoparticles of the same semiconductor material. The nano-needles or nanowires can thus grow from the nanosize holes in a mask layer that is inert to the gas phase growth of the semiconductor epilayer. A reinforcement of a thin-film is thus a vertical reinforcement with a plurality of nanowires as a needle pad embedded in the thin-film. In fact, nanowires 104 of III-V material have very good strength properties compared to bulk material e.g. with an increase of Young's bulk module from ~90 GPa to ~180 GPa for gallium arsenide. Details of the mechanical properties of nanowires are described by Wang et al., Adv. Mater. 2011, 23, 1356-1360, incorporated herein for reference.

The nanowires 104 can be made with Metal organic vapor deposition (MOCVD). The thickness of the holes in the mask for growing the nanowires 104 may be configured to nucleate wurtzite crystal structure having a size between 5-25 nm for elastic deformation of the nanowires.

The nanowires 104 can be grown in a Close Coupled Showerhead-MOCVD reactor. Thus, high reproducibility is achieved for the growth of nanowires 104 at defined locations on large wafer surfaces. III-V semiconductors can be grown by decomposition of a precursor molecule which reacts with a hydride gas. An example is when the III-precursor is trimethylindium and where the V-precursor substance is phosphine (PH3).

Disadvantages of previous methods of growing nanowires 104 as compared to the preferred self-organizing method of the invention are summarized as follows:

Nanowire growth with aerotaxy uses the growth of the nanowires in the gas phase, which does not provide the desired crystal orientation <111> for growth on a <100> silicon substrate and the alignment of nanoscale components. Etching of the metal particles can be performed with gold etching using e.g. reactive ion etching (RIE), but the method does not provide a means for the co-integration of different high-mobility semiconductors such as InSb and germanium. Lithographic definition of gold for nanowire growth does not provide a route for the co-integration of various high-mobility semiconductors. Epitaxial layers could be made on silicon, but not co-integrated with a large difference in lattice constant.

Nanowire growth by self-organization of semiconductor nanocrystals in lithographically defined nanosize holes for nanowire growth is the preferred way of growing nanowires according to the invention. This enables co-integration of two separate semiconductor materials side-by-side by self-organization of semiconductor nanocrystals. Monocrystalline semiconductor nanoparticles self-organized from a colloidal suspension during solvent evaporation and homoepitaxial growth from such semiconductor nanoparticles provide a way to co-integrate two different high-mobility semiconductors as epilayer-shaped islands side-by-side.

Thin epitaxial layers are achieved by no compensation of a difference in lattice constant of the epilayer and the nanowire in the direction perpendicular to the substrate 101. Such a buffer layer as referred to in terms of the prior art would have to start with a substrate having a lattice constant close to the desired channel material and repeated epitaxial growth of III-V alloys with a gradient in the lattice constant with multiple epilayers i.e. strained-layer epitaxy until the lattice constant is sufficiently close to the lattice constant of the desired channel material. According to the invention, the homoepitaxial growth of the same material as the self-organized semiconductor nanocrystals means that no buffering of lattice constant is needed for integration on a silicon substrate.

It is preferable to manufacture the nanoparticles of semiconductors by illuminating a previously grown epilayer on an inert substrate such as sapphire for gallium nitride crystals with femtosecond laser to thermally dissolve the epilayer into a plurality of semiconductor nanoparticles. It is preferred that the nanoparticles from which the nanowires grow are aluminum nitride, gallium nitride, gallium arsenide, indium phosphide, indium antimony, or semiconductor alloys.

Figure 2:
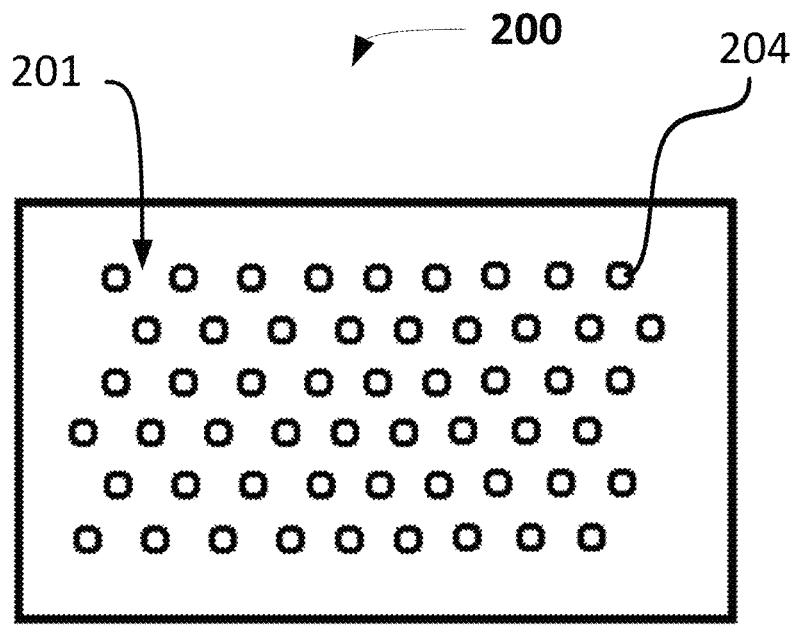
FIG. 2 discloses an embodiment 200 of the reinforced thin-film device where a plurality of in parallel spaced supporting semiconductor nanoneedles 204 are arranged in a hexagonally closed-packed structure.

FIG. 2 shows the thin-film device 200 with a plurality of in parallel spaced supporting semiconductor needles 204 arranged in a hexagonal close-packed structure 201. Individual nanowires 204 can be disposed on the substrate at a distance of 30-100 nm in a densely packed structure where the semiconductor needles comprised of lattice mismatched semiconductor.

The method of co-integration according to the invention, finds particular utility for CMOS devices and will be described together with particular embodiments relating to FIG. 3-12 in the following. According to the invention positions for NMOS and PMOS transistors can be precisely controlled for VLSI III-V CMOS processing for each type of epitaxial island. Thin epitaxial islands are made possible by this method so that heat can be dissipated which is generated using PMOS and the NMOS transistors in CMOS circuits. Because of the higher growth rate of nanowires and lateral overgrowth of nanowires, the crystal quality of thin 2D epilayers on silicon becomes much higher and dislocations are prevented from spreading in the direction perpendicular to the substrate to electronic components. Furthermore, p-dopant activation of germanium islands can occur without the III-V islands being affected, since the germanium islands can be treated before the growth of III-V islands. It is preferred according to the invention to co-integrate epilayer islands on silicon substrates with a selection of germanium for the p-channel and III-V semiconductor for the n-channel or a III-V semiconductor with particularly high mobility for positive charge carriers.

Figure 3:
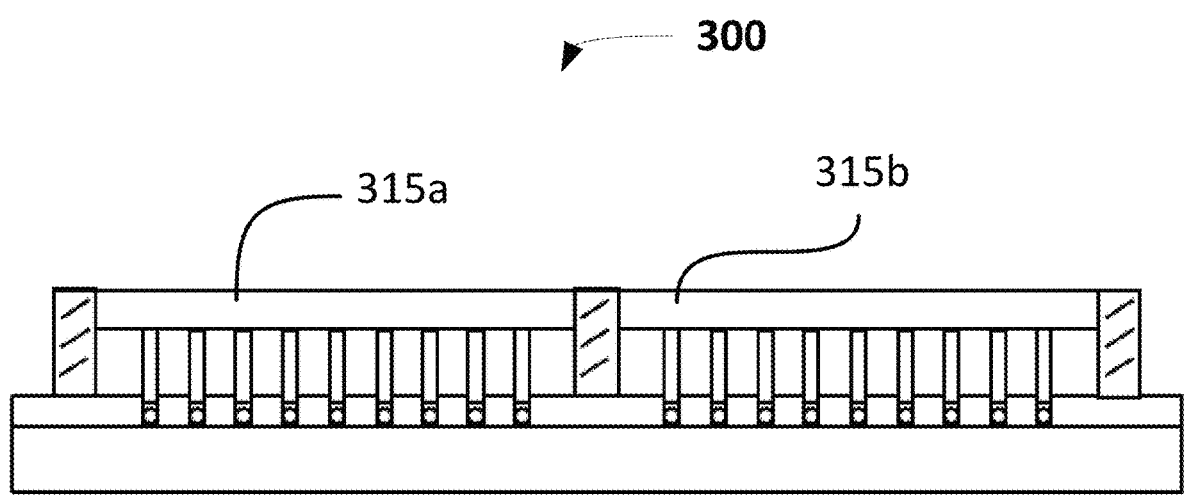
FIG. 3 describes an embodiment of the reinforced thin-film device 300 where the epilayer consists of isolated islands of a first lattice-mismatched semiconductor 315a and a second lattice-mismatched semiconductor 315b.

FIG. 3 shows the reinforced thin-film device 300 where the epilayer comprises a plurality of isolated islands of a first lattice-mismatched semiconductor 315a and a second lattice-mismatched semiconductor 315b.

Figure 4:
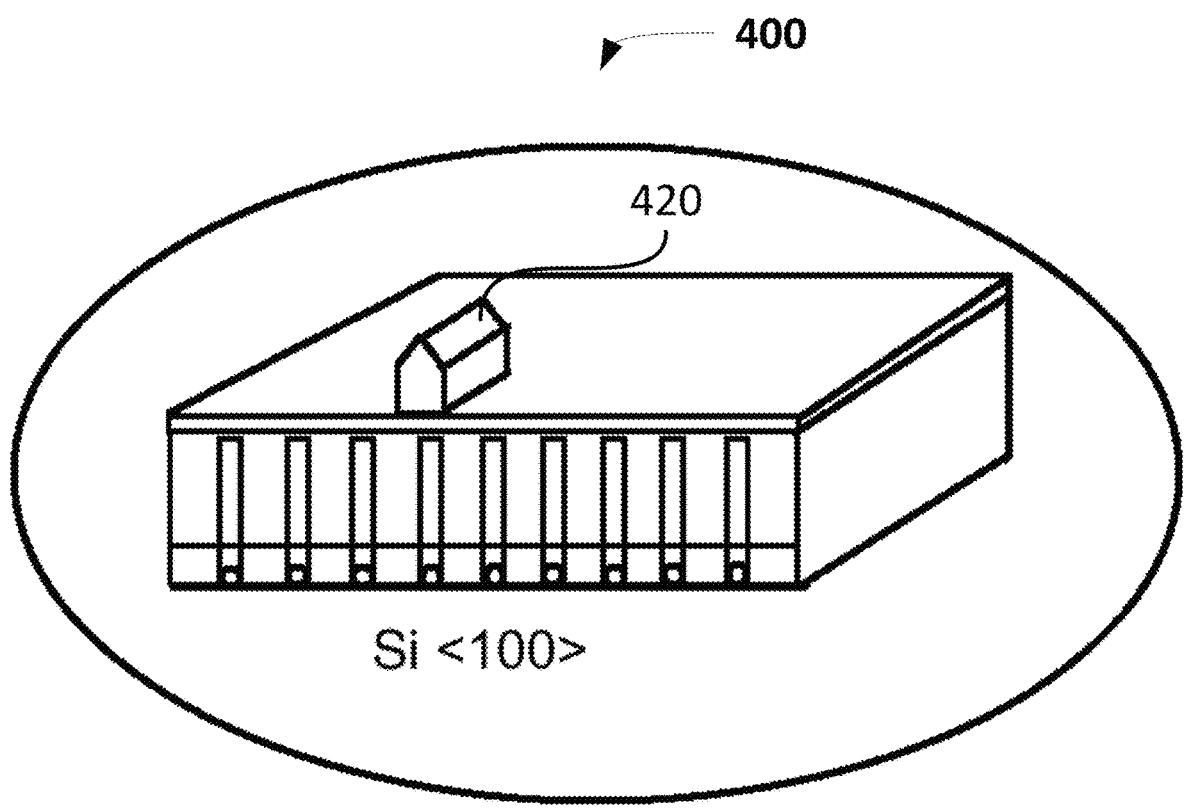
FIG. 4 describes a schematic view of a fin semiconductor device structure 420 on an epilayer 406.

FIG. 4 shows a schematic view of a fin semiconductor structure 420 on an epilayer 406. Fins of semiconductor material can be grown from mask layers where the fin semiconductor structure is epitaxially grown with a width less than 10 nm and a length of 50-200 nm.

Figure 5A:
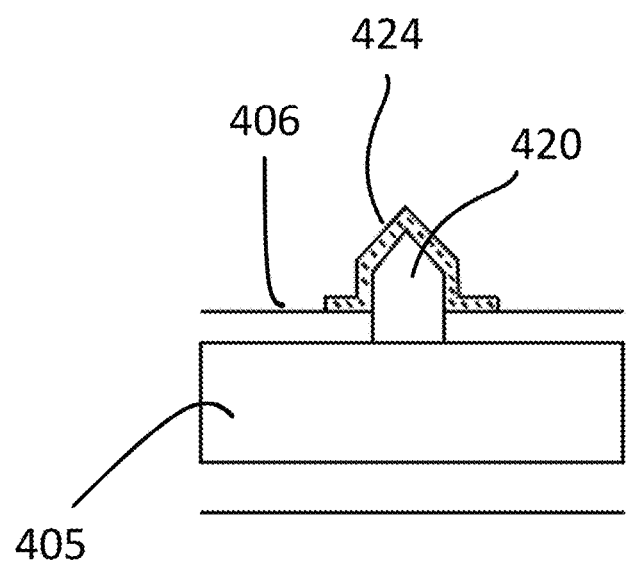
FIG. 5A shows a schematic view of a fin semiconductor device structure 420 on an epilayer island 405 with an enclosing gate electrode 424.

In FIG. 5A, a fin semiconductor structure 420 is shown on the epilayer island 405 with a surrounding gate electrode 424.

Figure 5B:
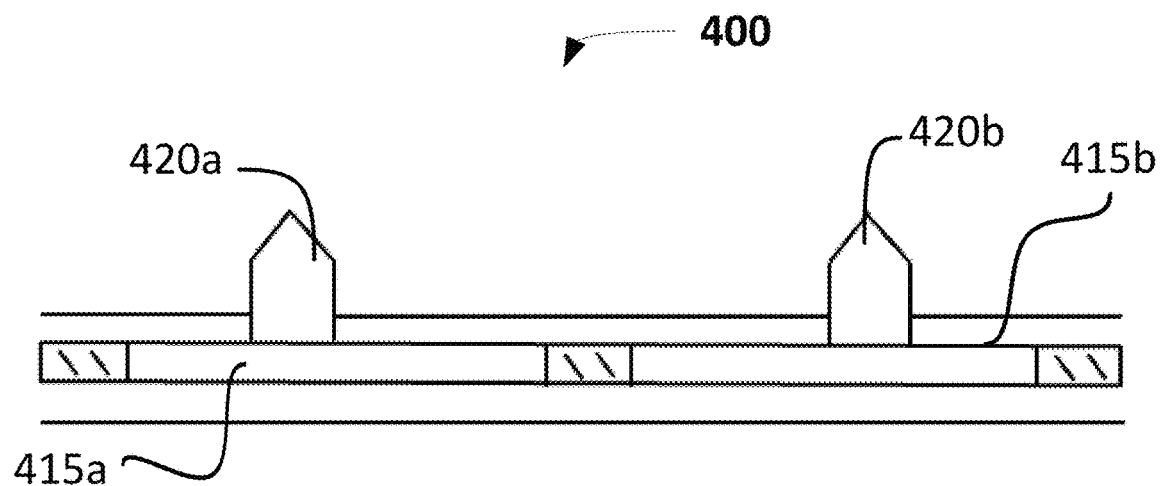
FIG. 5B shows a schematic view of two epilayer islands 415a in InGaAs and 415b in Ge.
Figure 6:
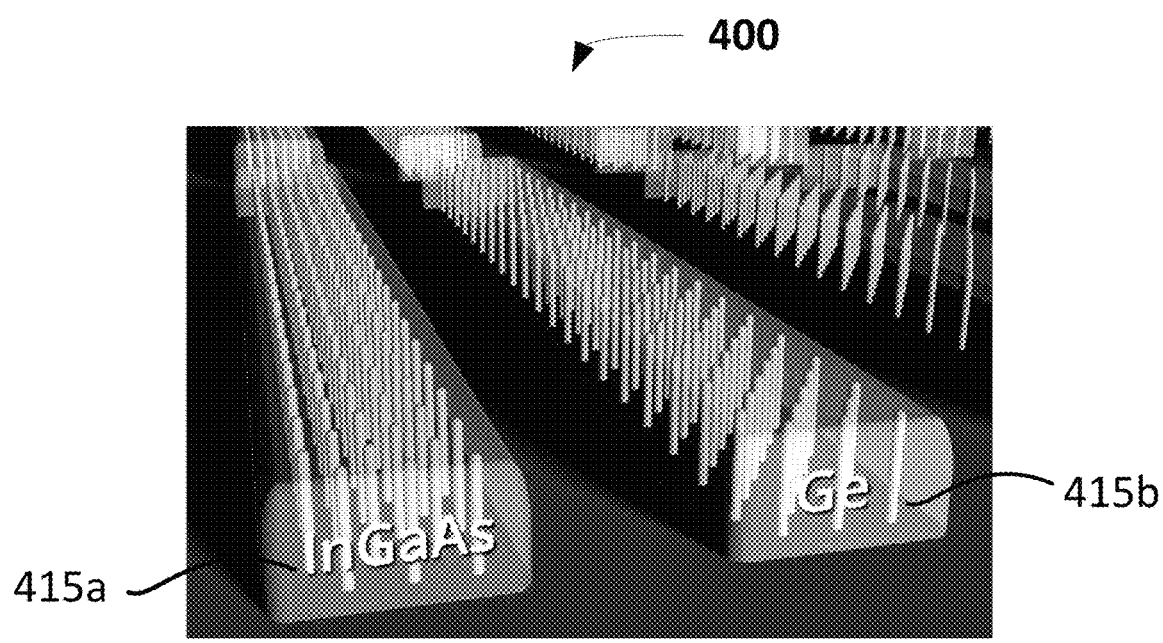
FIG. 6 shows a 3D view of a thin-film device 400 with a thin-film island 1515 in InGaAs and a thin-film in germanium 415b.

In FIG. 5B, the thin-film device 400 has two epilayer islands 415a in InGaAs and 415b in Ge. On each epilayer island there is a fin semiconductor structure in InGaAs 420a and a fin semiconductor structure in germanium 420b. It is preferable to configure PMOS transistors for 1-dimensional ballistic hole transport to compensate for low hole mobility and to match a high electron mobility of a NMOS transistor. Thus, a PMOS transistor and an NMOS transistor may be configured to comprise several FinFET transistors or a plurality of vertical nanowire field effect transistors on top of the two epilayer islands 415*a* of InGaAs and 415*b* of Ge. A 3D view of a thin-film device 400 is shown in FIG. 6 with an epilayer island 415*a* in InGaAs and an epilayer island in germanium 415*b*.

Figure 7:
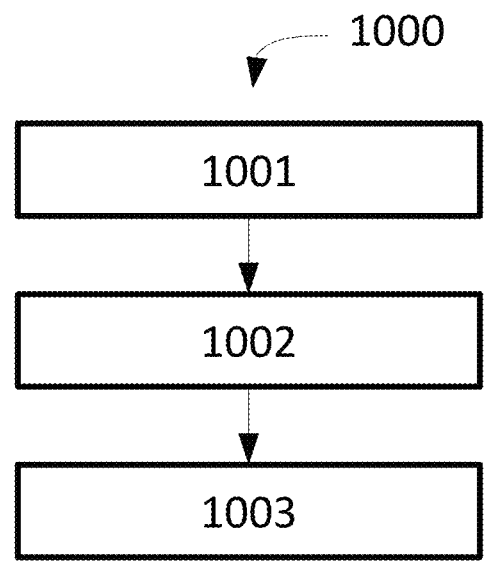
FIG. 7 describes an embodiment of the invention relating to a process 1000 for growing silicon wafers with epilayers of GaN.

An embodiment of the invention as depicted in FIG. 7 relates to a process (1000) for reinforcing a thin-film of GaN on silicon which comprises growing III-N nanowires by the following steps: (1001) to provide a substrate having a mask layer comprising at least one nanosize hole, (1002) to self-organize at least one GaN nanoparticle in said at least one nanosize hole on said substrate, and (1003) to grow at least one III-N nanowire with the crystal structure wurtzite from the GaN nanoparticle, preferably by epitaxially lateral overgrowth of the GaN nanoparticle in the C-direction of the wurtzite in the nanosize hole. The GaN nanoparticles are self-organized in the nanosize hole by a capillary force from an evaporating liquid suspension of GaN nanoparticles. The precursor substance flow of ammonia gas may be in the range of 10-30 sccm. The GaN nanoparticles may be self-organized in at least one nano-hole by neutralization of an acid ligand and an alkaline ligand provided on the GaN nanoparticle and substrate, respectively.

Figures 8, 9:
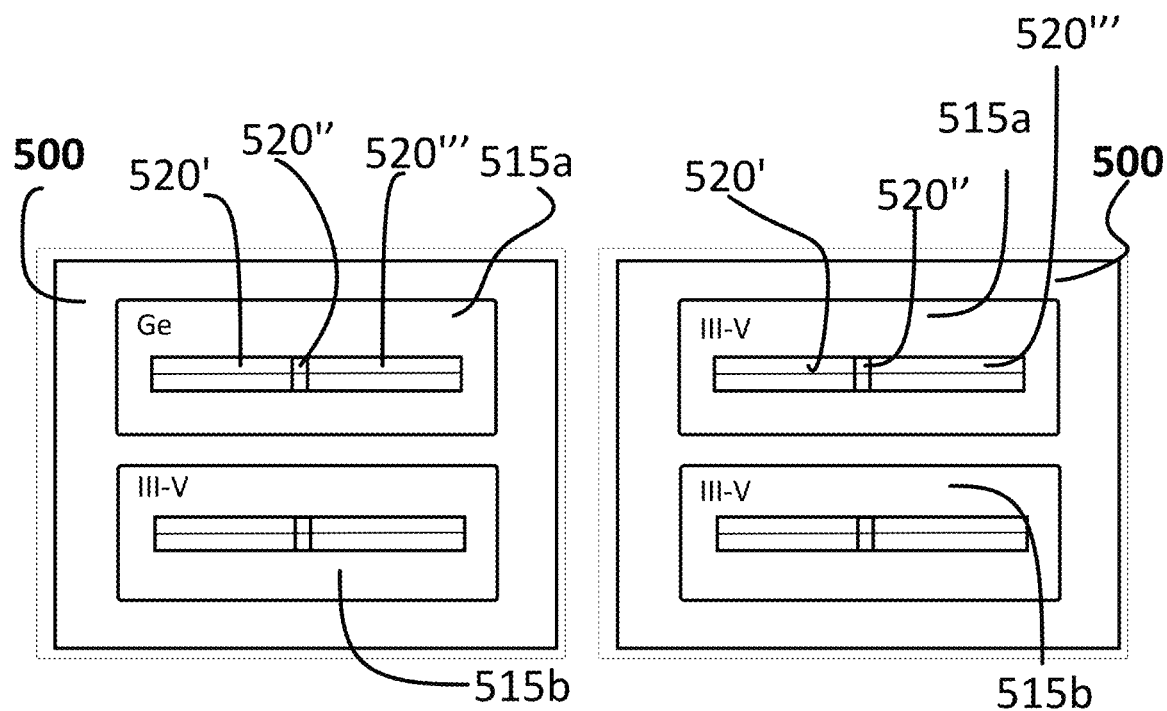
FIG. 8 describes a schematic view of a III-V semiconductor III-V semiconductor III-V epilayer co-integration with high charge carrier mobility.
FIG. 9 depicts a similar schematic view of a co-integration of two III-V epilayer islands as FIG. 8.

According to the invention, it is preferred to co-integrate one or more III-V semiconductors. Such a co-integration is depicted in FIG. 8 with a III-V epilayer 515*a* of III-V semiconductor with high positive charge carrier mobility and a III-V semiconductor epilayer 515*b* with high charge carrier mobility for negative charge carrier (electrons), respectively. A protruding epitaxially grown core portion 520 is shown from above which is ex-situ pnp-doped 520', 520", 520'''. A mask layer includes the epilayer islands 515*a* and 515*b* in a recess or major aperture where the epilayer layers are not lattice-matched to the substrate. Two III-V epilayer islands can also be co-integrated on a silicon substrate according to FIG. 9.

The thin-film may be arranged on a germanium epilayer 605 on silicon with an epilayer 606 of graphene. Such an embodiment is shown in FIG. 10.

In some embodiments, the thin-film 605 provided in the InAs, InP, GaAs, AlAs, ZnO, ZnS, AlP, GaP, AlP, GaN, AlN, InN, CdSe or alloys of AlInAs, InGaAs, AlGaAs, GaInP, AlGaN. The epilayer 606 may be disposed in InAs, InP, GaAs, AlAs, ZnO, ZnS, AlP, GaP, GaN, AlN, InN, CdSe or alloys of AlInAs, InGaAs, AlGaAs, GaInP, AlGaN. The epilayer 606 may be lattice-matched to said thin-film 605. These epilayers may also be islands in certain embodiments.

Figure 10:
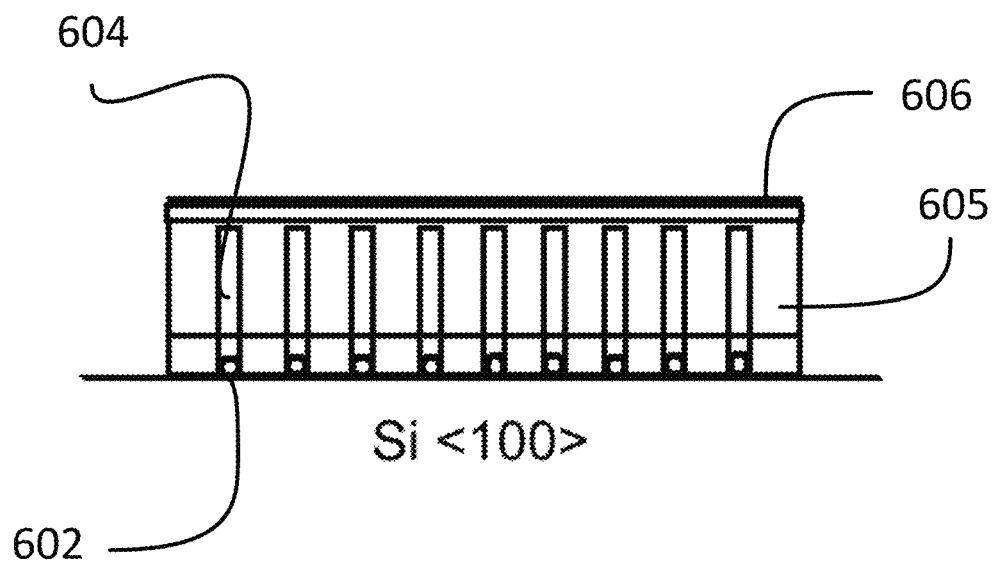
FIG. 10 shows how a thin-film 605 may be arranged in germanium 605 with an epilayer 606 of graphene.
Figure 11:
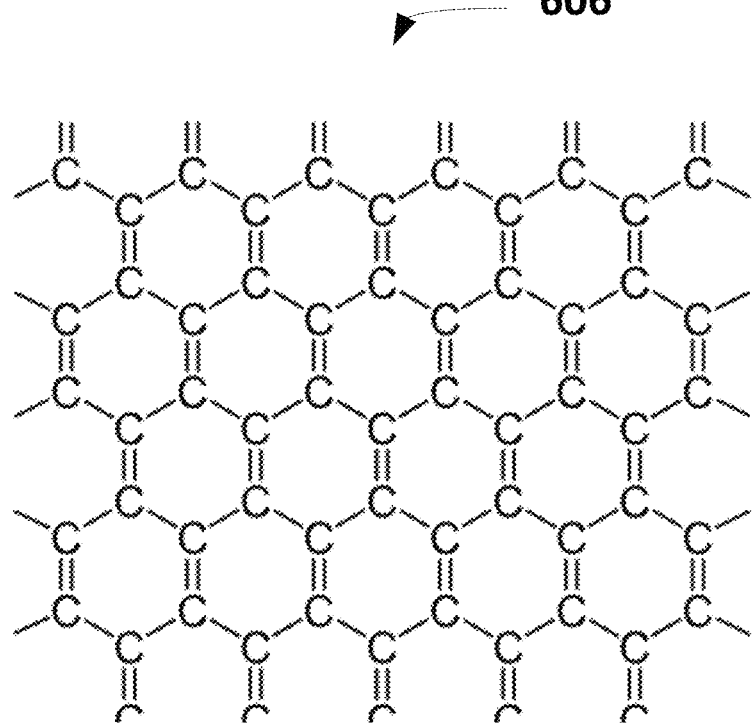
FIG. 11 shows a graphene monolayer from above according to the embodiment of FIG. 10.

In FIG. 10, the graphene monolayer 606 is supported by a plurality of densely packed nanowires 604 embedded in a thin-film 605. The nanowires 604 are arranged vertically grown from semiconductor nanoparticles 602. Graphene monolayers, as shown in FIG. 11, may be grown on (110) germanium. Details for graphene production on germanium surfaces is described by "Lee et al., Science Apr. 18, 2014: Vol. 344, Issue 6181, pp. 286-289", incorporated herein for reference. The advantage of using the graphene is primarily to avoid wrinkles in the graphene monolayer on small surfaces of a wafer for electrical components such as graphene quantum electronics.

Figure 12A:
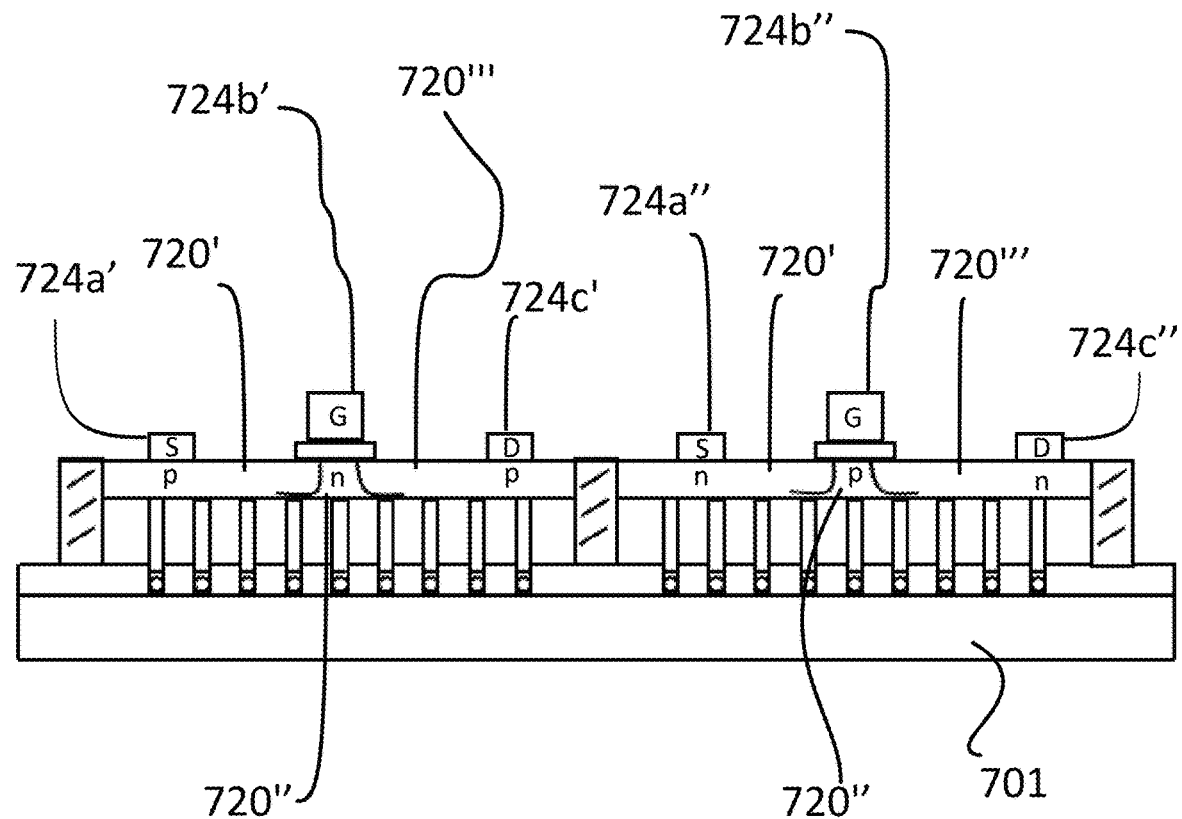
FIG. 12A schematically shows a hybrid III-V CMOSFET system (700') in combination with FIG. 12B.
Figure 12B:
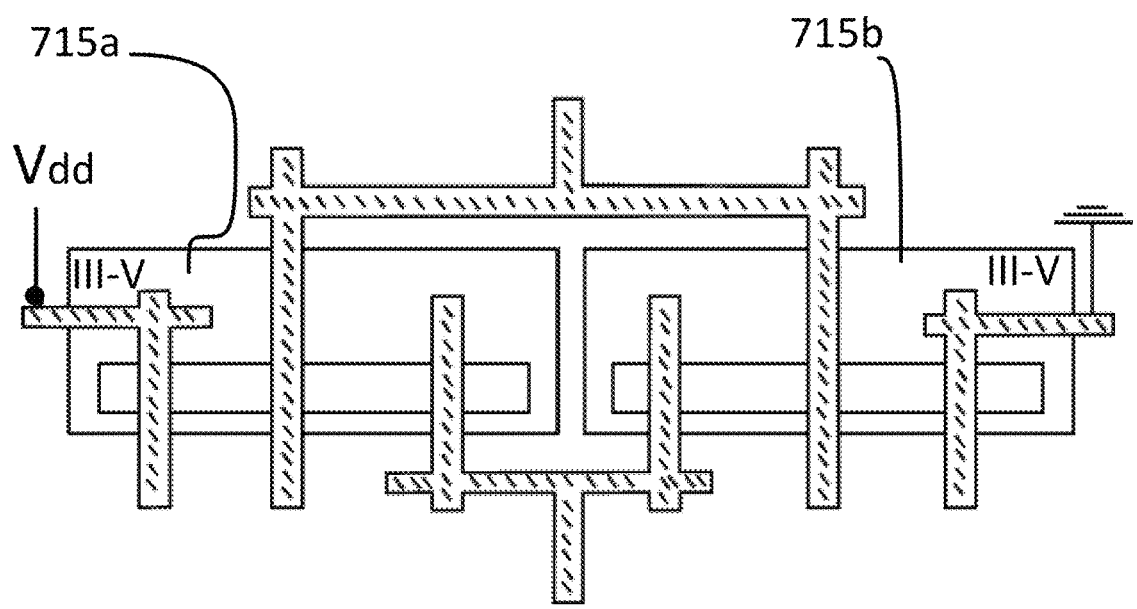
FIG. 12B shows a schematic top view of two III-V FinFETs electrically coupled as a III-V/III-V CMOS inverter based on the co-integration of the two epilayer islands 715a and 715b with protruding epitaxial semiconductor fins.

FIG. 12A schematically shows a hybrid III-V CMOSFET system in combination with FIG. 12B. A substrate 701 is provided with nanostructured cavities configured to contain a single semiconductor nanoparticle. In the nanosize cavities, semiconductor particles of high-mobility semiconductors are incorporated. By epitaxial growth of islands of semiconductor materials, two epilayer islands 715*a*, 715*b* with high electron mobility and high hole mobility are grown, respectively. On the respective epilayers, a PMOS transistor 720', 720", 720''' and an NMOS transistor 720', 720", 720''' are provided. The PMOS transistor may be configured for one-dimensional ballistic transport of holes to compensate for a low hole mobility and to match a high electron mobility of the NMOS transistor. Source contacts 724*a*', 724*a*", drain contacts 724*c*', 724*c*" and gate contacts 724*b*', 724*b*" are arranged on respective doped parts of the epilayer islands.

FIG. 12B shows a schematic top view of two III-V FinFETs electrically coupled as a III-V/III-V CMOS inverter based on the co-integration of the two epilayer islands 715*a* and 715*b* with protruding epitaxial semiconductor fins. It is preferred according to the invention to make the channel materials of a FinFET technology thin to make a 1-dimensional semiconductor. In particular, the electron transport increases as the radius of a 1-dimensional semiconductor is about 7-18 nm.

A reinforced thin-film device 100 may be provided with a thin epitaxial III-V epilayer to form epitaxial islands side-by-side according to the invention. A mask layer is deposited on each epitaxial island, and in the mask layer elongated cavities are opened centrally over each epitaxial island by lithography such as EBL or nanoimprint lithography. It is preferred that the mask layer 103 is silicon nitride. In each elongated cavity, epitaxially elongated fin semiconductor structures are grown, e.g. with a length of 50-100 nm. It is therefore preferred that elongated cavities have a nanostructured width of about 5-50 nm to make horizontal elongated epitaxial protrusions. These protruding epitaxial fins are in-situ p- and n-doped, respectively, to be configured as PMOS and NMOS transistors. On a protruding epitaxial portion an intrinsic shell layer of 1-10 nm (preferably 10, 7, 5 or 1 nm) is grown for current ITRS transistor nodes. On the intrinsic epitaxial shell layer, an in-situ doped shell layer is grown. The inner shell layer can comprise the transistor source and the outermost shell layer can constitute the drain. The horizontal protruding epitaxial portions may be in-situ p-i-n-doped and n-i-p-doped, respectively, in the radial direction of the elongated epitaxial protrusions above the substrate. In order to provide contacts to the intrinsic shell layer, in the epitaxial radial direction, a high-k dielectric oxide is deposited over the middle portion of the protruding epitaxial portion, dividing the protruding epitaxial portion into two.

To provide metal contacts to the protruding epitaxial portion at the respective ends of the p-i-n junction lithographically, a metal contact is made at the inner core portion of the protruding epitaxial portion and one contact to the outer shell. The charge carriers, electrons and holes, tunnels through the intrinsic layer but the current in the radial direction of the protruding epitaxial p-i-n semiconductor structure is turned off and on with the gate voltage when the gate contact substantially encloses the intrinsic layer, causing a charge carrier channel to be created for passage along the p-i-n direction from the core to the outer layer located to the extent of the gate electrode. When the gate electrode size is limited lithographically and the doping for a pnp or npn transition in the longitudinal direction is limited by the localized dopant atoms, it is more advantageous that the thickness of an epitaxial intrinsic layer can be controlled with abruptly grown crystalline shells in the range 1-10 nm and especially the range 1-5 nm with MOVPE. An advantage of the core-shell based FinFET transistor is that the contacts can be provided in the same plane as the substrate.

It is preferred to grow a wide bandgap barrier layer defining the ability of electrons to tunnel between the protruding core portion of the intrinsic layer. By lithographically defining a nanostructured oxide layer over the middle part of the protruding part, a barrier shell can be grown only on the remaining parts.

It is preferred to use a combination of germanium nanocrystals and InSb nanocrystals for the growth of islands on a silicon wafer for CMOS transistors according to the invention. The precursor substance iBuGe can be used to grow germanium nanowires.

In order to match the conductivity of positive charge carriers to the higher mobility of negative charge carriers for III-V/Ge CMOS, it is preferred that a plurality of PMOS transistors be used in combination with a single NMOS transistor or that the protruding epitaxial portions are configured for one radius to enclose electrons in a 1-dimensional semiconductor where the radius is shorter than for the NMOS transistors by adjusting the height of the protruding epitaxial portion and the thickness of the cavity, respectively, for ballistic transport. The valence band of the semiconductor is influenced by stresses in the crystal structure, which pulls apart the valence bands for light and heavy positive charge carriers so that it becomes anisotropic. The epitaxial protruding portions of the NMOS transistors may have mobilities matching the PMOS and having radii in the range of 7-18 nm as the electron mobility increases linearly in this range. However, such improvements are very low with III-V semiconductor materials.

Figure 13:
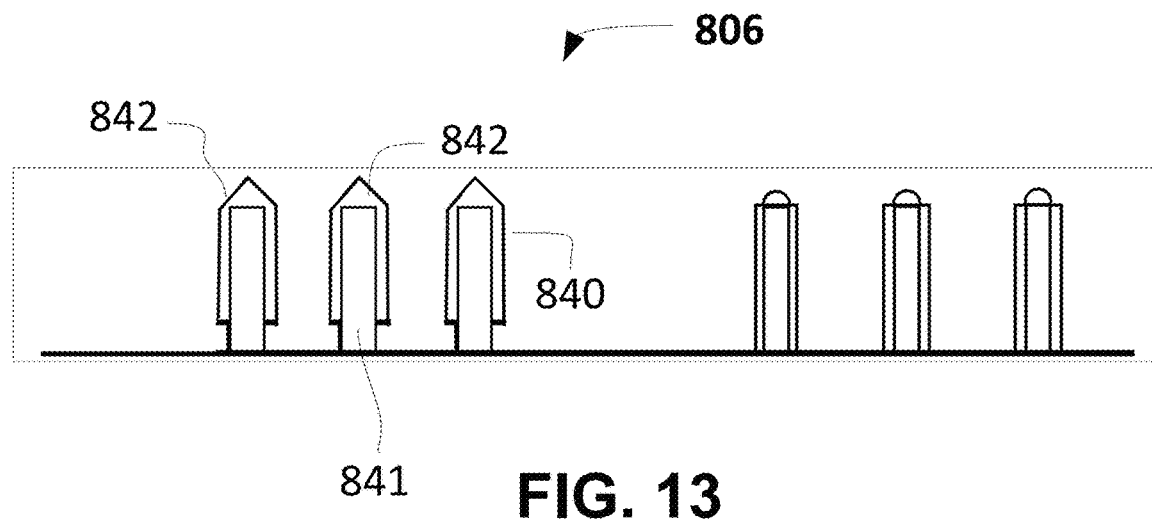
FIG. 13 shows a schematic side view, in cross-section, of an epilayer 806 which includes a heterostructure (841, 842) of III-V semiconductor with p- and n-doping, respectively, which forms a pn junction in a nanowire radial direction.

FIG. 13 shows a schematic side view, in cross-section, of the epilayer 806 comprising a heterostructure (841, 842) of III-V semiconductor with different bandgaps having a 1-10 nm thin middle portion. The epilayer 806 comprises a III nitride nanowire arranged on an epilayer where the nanowire has the LED structure seen from the inside to the outside of an nGaN core wire and a pGaN shell.

According to a dispersion relationship, the energy of electrons can be written as a function of the wave vector of the band structure in the bulk semiconductor and thus approximated by a parabola. The charge carrier density is therefore inversely proportional to the square root of the electron's energy when electrons are trapped in two spatial dimensions and free in one dimension. Similarly, the charge carrier density becomes constant for electrons trapped in a spatial dimension and slightly growing as the root of the energy of electrons free in three spatial dimensions. This makes it preferable to trap electrons into one-dimensional semiconductors such that the charge density diverges near the bottom of the conduction band for use in photonic components.

Figure 14:
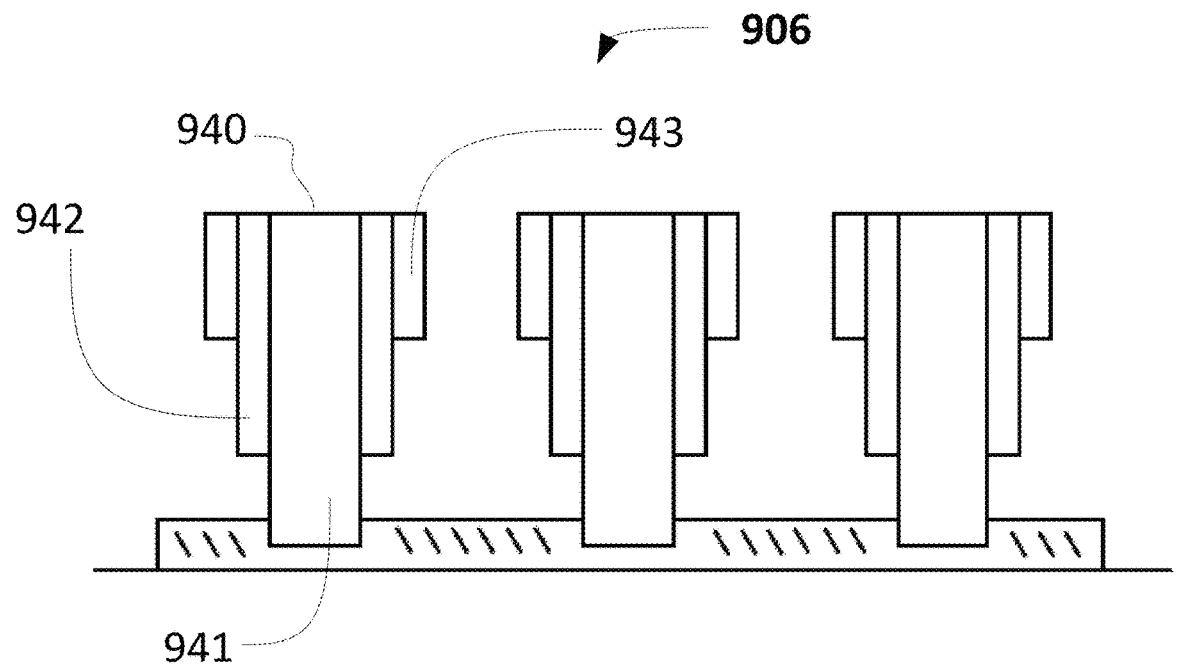
FIG. 14 shows a schematic side view, in cross-section, of the epilayer 906 comprising a heterostructure (941, 942, 943) of III-V semiconductor with different bandgaps having a 1-10 nm thin middle layer 942.

FIG. 14 shows a schematic side view, in cross-section, of the epilayer 906 comprising a heterostructure 940 of III-V semiconductor with different bandgaps having a 1-10 nm thin middle layer 941. The heterostructure 940 may be in-situ doped in any of the outer shells for modulation doping of a quantum well. The abutting outer semiconductor layers 942, 943 have larger band gaps than the middle layer 941 in the heterostructure 940. The heterostructure 940 may be provided for III-nitride nanowires having the LED structure (seen from the inside to the outside of a core shell nanowire) GaN core/AlGaN shell/GaN barrier shell/InGaN active layer shell/GaN barrier shell/GaN shell where C plane is the most polar plane for gallium nitride.

In the following, devices for post-III-V CMOS will be described which require extremely dislocation-free substrates in III-V semiconductors such as the thin-film device described herein vide supra and in particular devices which are embodiments of a Majorana quantum computer. Compared to electrons, majorana fermions are their own anti-particles. For majorana quasi-particles, creation operators and annihilation operators can be written $c=\gamma 1+i\gamma 2$ and $c\dagger=\gamma 1-i\gamma 2$ where particle-hole symmetry exists at E=0 (OK), which gives the following identity relation between annihilation operator and the creation operator for majorana fermions, $\gamma=\gamma\dagger$.

Figure 15:
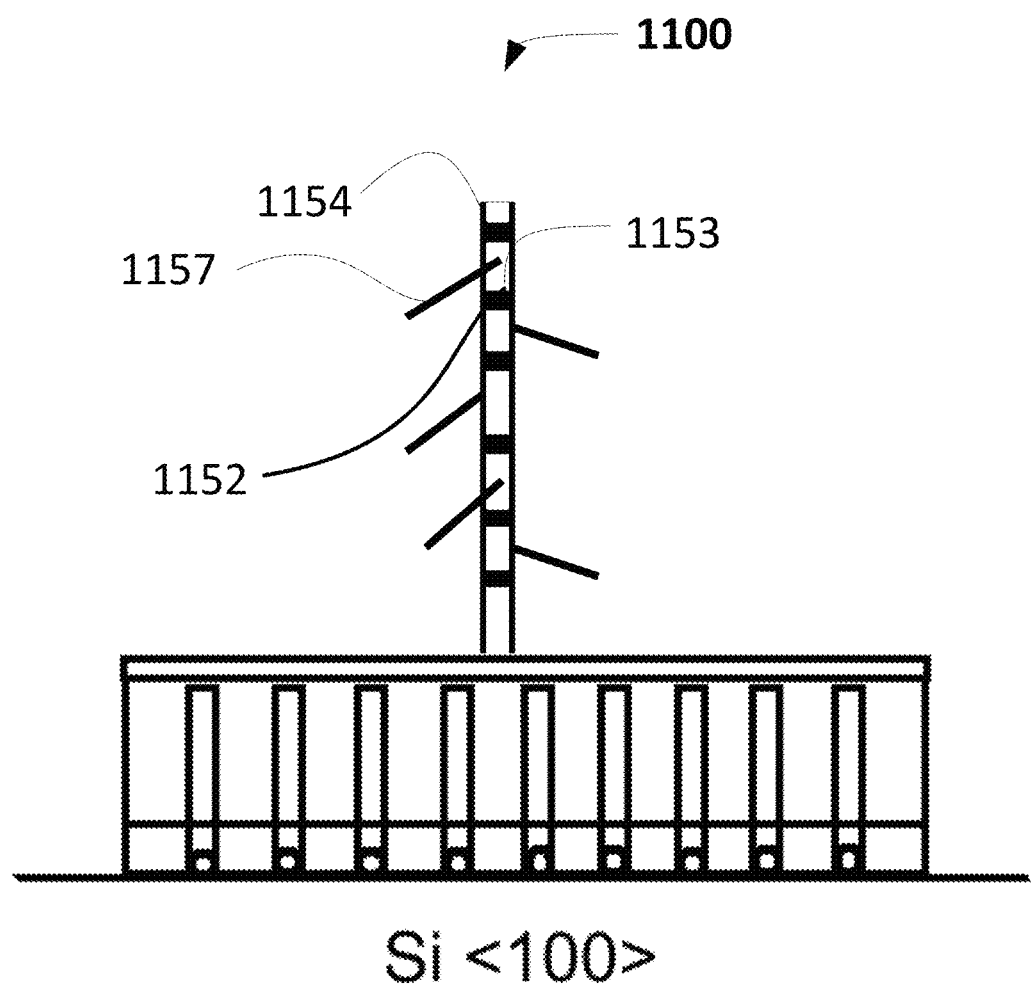
FIG. 15 shows an embodiment of a Majorana T gate 1100 where branches are grown on a nanotree having a heterostructure (1150, 1152, 1153, 1154, 1155) with barrier materials in III-V material (1152, 1154), and superconducting contacts 1156, 1159, 1158.

FIG. 15 shows a schematic view of a T-gate 1100 as a nanotree on an epilayer of indium antimonide to support perfectly dislocation-free crystalline indium antimony nanowires (1152, 1153, 1157, 1154) which is 1-10 nm thin vertically free-standing on a silicon wafer. On segment 1153 of the vertical nanowire, nanowire branches 1157 are grown (see band structure in FIG. 17, E (z) and z direction are vertical to the substrate and E (x) is x-direction along the axial direction of the branches in FIG. 15). The vertical nanowire may have two energy barrier semiconductor materials (1152, 1154) arranged in the axial direction alongside branches 1157 electrodes. The vertically arranged indium antimony nanowire may comprise at least two singlet-wave superconducting (s-wave) wrap-around-gate electrodes. The nanowire branches 1157 may include an s-wave superconducting electrode 1158.

In a one-dimensional nanowire, majorana quantum particles arise which are pairwise majorana fermions in the end states of the respective quantum wells (1153, 1154), which depends on the strength of a magnetic field and the configuration of the so-called band structure "Majorana zero gap". It is preferred to arrange the T-gate with nanotrees because it is possible to epitaxially grow energy-barrier material segments (1154, 1153) in-situ in the vertical direction towards the substrate along the nanowires and energy-barrier material segments in-situ along the branches 1157 with seed particles. It is also preferred to provide the band structure as two parabolic bands for electron transport for spin-up and spin-down, i.e. "spin-orbit splitting" through a semiconductor with high spin-orbit coupling such as alloys of indium antimonide.

The nanotree (1150, 1152, 1153, 1154, 1155, 1157) has branches 1157 which may be provided with gold seed particles and gas phase chemical growth with MOVPE. Branches 1157 can be grown by aerosol deposition of gold seed particles between GaSb or GaAsSb, InAaSb (1152, 1154) semiconductor barrier segments along the axial direction of the vertical nanowire 1155. Details on how nanotrees can be grown are described in the scientific article "Kimberly Dick et al., Nature materials, Vol. 3, 2004", incorporated herein by reference. It is preferred to use electrostatic depletion of at least a portion of the nanowire to perform a topological quantum operation.

In the following, an embodiment of a topological quantum operation will be described in accordance with FIG. 16 and FIG. 17 in combination for the embodiment of FIG. 15 without any intention of being limiting.

The topological quantum operation (2000) is provided by (2001) a T-gate with two respective majorana particles in a first quantum well 1150 and a second quantum well 1155; (2002) the T gate is positively biased with a voltage across the electrodes 1159 and 1158, by which a majorana fermion is flowing to the wire branch 1157 from the horizontally disposed nanowire portion 1150. By applying a voltage across the electrodes 1159 and 1158, an energy barrier is lowered in the L-shaped heterostructure, InSb (1150)/GaInSb (1153)/GaInSb/InSb (1157).

Figure 16:
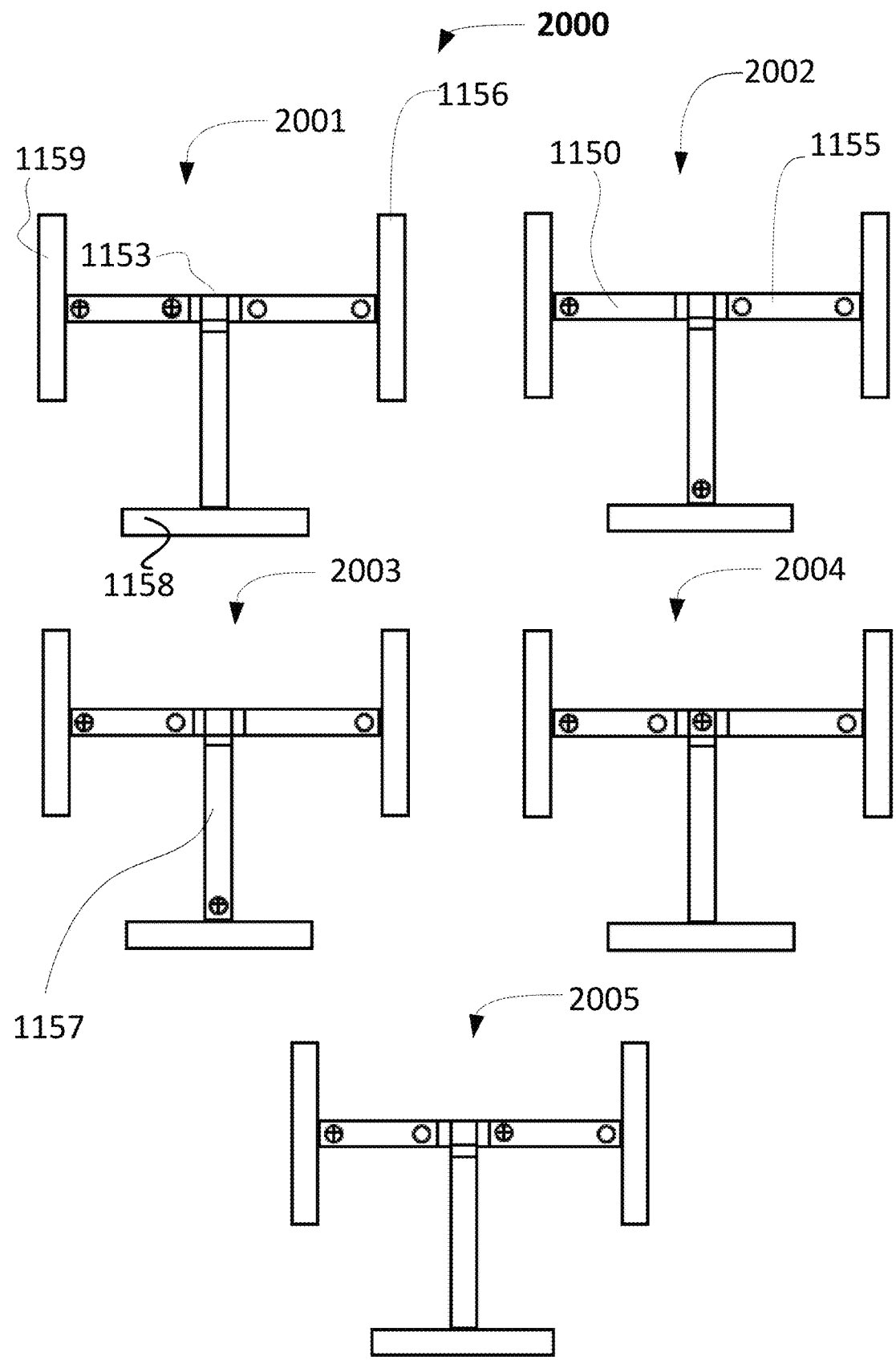
FIG. 16 shows an embodiment 2000 of a topological quantum operation as a braid of quantum mechanical wave functions for major quantum particles such as paired fermions with a T gate having a node with 3 adjacent energy barrier segments.
Figure 17:
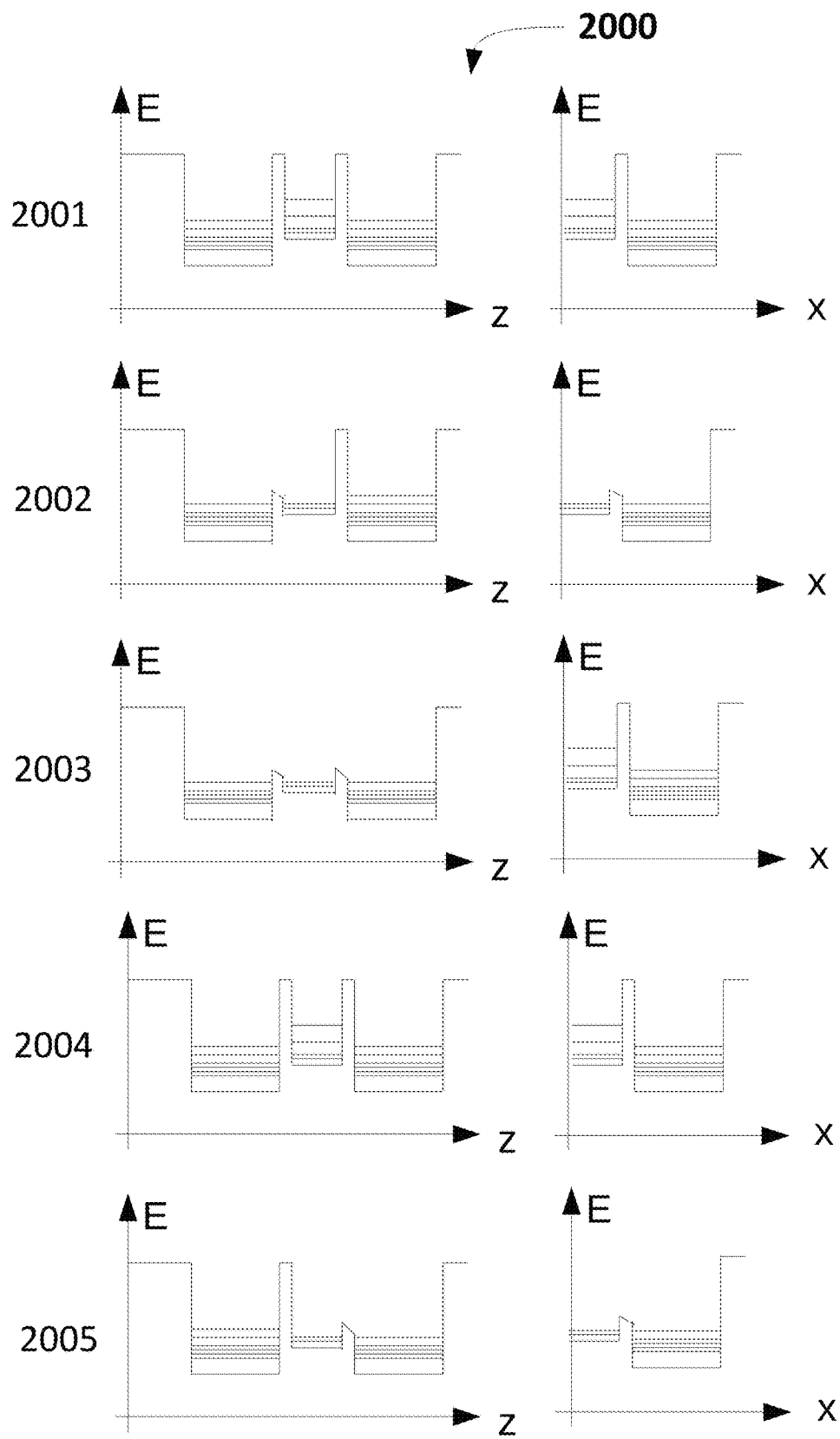
FIG. 17 shows an embodiment 2000 with an energy diagram for a topological quantum operation according to FIG. 16.

Thereafter by (2003) applying a bias voltage which lowers the energy barriers for the horizontal nanowire in FIG. 16 according to FIG. 17 with a bias voltage across the electrodes 1156 and 1159, a second majorana fermion flows from a first quantum well 1155 to a second quantum well 1150. Thereafter, by (2004) applying a positive bias voltage across electrode 1158 and electrode 1156 lowering the energy barriers in the heterostructure InSb (1157)/GaInSb/InSb (1153)/GaInSb/InSb (1155), after which a majorana fermion flows from the nanowire branch 1157 to the node quantum well 1153 and on to the second quantum well 1155. (2005) Thus, the original wave functions of the two majorana quasi-particles are braided once and are back in the same position as the provided original position 2001.

The T-gate can perform multiple quantum operations by braiding, double-braiding, triple-braiding, etc. two wave functions in a vertically arranged heterostructure nanowire. It is preferred to interconnect a plurality of T-gates to detect annihilated majorana fermions.

It is preferred to provide the band gaps for the respective semiconductors or alloys thereof for the segments (1154, 1153, 1152, 1157) according to the energy diagrams of FIG. 17.

A 16-bit quantum bit nanotree register can be configured through a plurality of quantum bits on the same vertical nanowire describing a superimposed wave function. It is preferred to form various heterostructures by in-situ grown semiconductor materials since one of the major problems with majorana quantum computers is that interfering quasi-particles arise due to disorder in the crystal structure. Each N-quantum bit register for each nanotree may be coupled through respective quantum wells to other quantum gates. With 100 quantum wells, $1.26*10^{30}$ times more operations than a conventional computer could be done. An advantage of this embodiment 1100 is that the potential computer capacity becomes enormous. Another advantage is that it is possible to grow thousands of nanotrees of indium antimonide alloy with a very small proportion of dislocations on a silicon wafer with in-situ barrier segment growth vertical to the substrate and along branches 1157.

Schottky barriers are small in metal contacting of indium antimonide and are advantageous because small magnetic fields can be used to generate majorana fermions. Contacts to nanotrees can be superconducting NbTiN materials. Spin blockade can also be used to detect the spin of a fermion in a quantum dot. This enables topological quantum computers with low decoherence with quantum states that protects braided majorana states. Further details relating to topological quantum information, quantum operations for storing or for carrying out logical operations with quasi-particles are disclosed in "Nature Nanotechnology, 13, 192-197 (2018)", incorporated herein for reference.

One example of an embodiment comprises the reinforced thin-film device and an III-V FinFET transistor that further comprises; two nanostructured electrodes radially enclosing respectively a source end and a drain end of said protruding core portion in a direction perpendicular to the longitudinal direction of said core portion, wherein a central portion of said protruding core portion is enclosed by a high-k-dielectric oxide shell with a nanostructured gate electrode radially enclosing said oxide shell in said perpendicular direction, wherein said protruding core portion is pnp-doped or npn-doped, wherein said central portion is n- or p-doped and has a thickness in said perpendicular direction that is less than 10 nm, and wherein said protruding core portion is configured to match a higher intrinsic mobility of negative charge carriers than for positive charge carriers through the protruding epitaxial portions having a height and a width respectively to enclose electrons in a 1-dimensional semiconductor for ballistic transport; and wherein the epitaxial protrusions have radii in the range of 7-18 nm, preferably where said oxide shell is amorphous hafnium oxide. Several PMOS transistors can be used in combination with a single NMOS transistor for hybrid III-V/III-V or III-V/Ge CMOS.

Another example of one embodiment is a thin-film device comprising a germanium thin-film and a germanium nanowire needle pad embedded in the thin-film. Graphene can be grown on the thin-film of germanium with CVD to produce electrical contacts or electronic components in graphene. In other embodiments, the graphene layer may be a 2D dimensional monolayer or a graphene island and may be functionalized with biomolecules, organic molecules, antibodies, proteins, or DNA for graphene transistors where the graphene layer is coated with electrical contacts of Ti/Pd/Au and in contact with a microfluidic channel. In some embodiments of the thin-film device, this device is a biosensor comprising a thin-film device having a germanium epilayer, wherein a monolayer of graphene is arranged on said epilayer of germanium, and wherein said monolayer of the graphene is functionalized with at least one biomolecule or organic molecule, and wherein said monolayer of graphene is coated with contacts of Ti, Pd or Au.

An example of an embodiment is a nanowire-based display where specific nanowires are grown on different micro-sized surfaces to make pixels of the colors red, green and blue where the blue color comes from nitride nanowires and red and green come from the III-V nanowire quantum wells. In such embodiments, the nanowires are grown in descending temperature; III-nitride nanowires from GaN nanoparticles and then III-V nanowires with gold particles as catalyst particles. Another advantage of the embodiment is that III-N alloys can be combined with III-V alloys to configure the bandgap for RGB LEDs. The band gap for In1-xGaxN is configured for blue electroluminescence and the InAlGaAsP semiconductor alloy is configured for red and green electroluminescence, respectively. The modulation dopant atoms from each side of the quantum well migrate to the bottom of the quantum well in the diode structure. By doping the heterostructure of the nanowire in-situ so that the energy barrier semiconductor is doped, charge carriers can be donated to quantum wells, giving a very high density of charge carrier in a two-dimensional charge carrier gas.

Another example of an embodiment of the invention relates to a reinforced thin-film device comprising a gate stack comprising an epilayer having a semiconductor channel of III-V semiconductor; a substantially thin wide band gap semiconductor layer at a central portion of said semiconductor channel disposed epitaxially on said semiconductor channel to capture impurity states, and a high-k oxide layer disposed on said high-k dielectric constant semiconductor and said wide bandgap semiconductor. The gate stack may be provided for a planar pnp or npn transistor, a nanowire transistor or a FinFET transistor.

In one example of the invention, AlGaN/GaN is grown on a silicon wafer and is patterned to create top-down nanowires. The nanowires are laterally overgrown to grow a coalesced GaN thin-film on silicon that is reinforced by AlGaN/GaN nanowires. In another example, nanowires of InP are grown selectively on (111)-silicon and laterally overgrown to form a thin-film of InP on silicon.

In one example of the invention GaN is disposed on a silicon wafer and a backside of the wafer is dry reactive ion etched to release the GaN thin-film.

Another example of an embodiment 806 relates to a III-N nanowire LED which includes; a doped core wire, a shell layer having a lower band gap than the said core wire, wherein said shell layer is etched in-situ, and wherein said core wire comprises an enclosing electrical contact. The core wire is in-situ p-doped and where at least one shell layer is an n-doped shell layer. The core wire is in-situ n-doped wherein at least one shell layer is a p-doped shell layer.

Another example of an embodiment of the thin-film device comprises a III-V nanowire laser comprising a nanowire with a p-doped core wire, an n-doped shell layer on the nanowire so that it encloses the said core wire which together forms a diode band structure, where the core wire is p-doped in-situ during C plane growth with the highest possible growth rate from the polar C plane, and where the shell layer is intrinsically doped and n-doped at a low growth rate from the non-polar M plane or A plane so that the diode band structure obtains the maximum doping for photonic applications of III-V material on silicon. These nanowire laser structures can be integrated with silicon CMOS electronics.

In one example embodiment of the thin-film device, the epilayer consists of III-V semiconductor and germanium with respective epitaxial protruding portions with n-p-n and p-n-p-doped segments in the longitudinal direction, respectively, of which the middle doped portions may be 10-14 nm in thickness for III-V/Ge CMOSFETs or III-V/III-V CMOSFET where said protruding portions are grown on hybrid epilayer islands of a high mobility p-channel material and an n-channel material, respectively.

Another example of an embodiment of the invention relates to a process for growing III-N nanowires, preferably on a thin-film device having a gallium nitride epilayer comprising; providing a thin-film device with a mask layer comprising at least one nanosize hole, self-organizing at least one GaN nanoparticle in said at least one nanosize hole on said substrate, and growing at least one III-N nanowire with the crystal structure wurtzite from said GaN-nanoparticle, preferably by epitaxial lateral overgrowth of said GaN nanoparticle in the C-direction of the wurtzite in said at least one nanosize hole. The GaN nanoparticles are self-organized in the nanosize holes by a capillary force from an evaporating liquid of a suspension of GaN nanoparticles. The precursor substance flow of ammonia gas may be in the range of 10-30 sccm. Said GaN nanoparticles may be self-organized in said at least one nano-hole by neutralization of an acid ligand and an alkaline ligand on said GaN nanoparticle and said substrate in said at least one nano-hole, respectively. The said GaN nanoparticles can be produced by a thermal laser synthesis from GaN powder.

Another example of one embodiment relates to a III-N nanowire LED (100) which includes; a doped core wire 840 of the crystal structure wurtzite on a substrate, a first shell layer (842) having a lower band gap than said core wire (103), and wherein the core wire (841) comprises a second doped shell layer on the first shell layer wherein the core wire is grown on a substrate of a different crystal structure than wurtzite. The substrate may be configured for the orientation of <111>A or <111>B zinc blende for the growth of III-V nanowires. The core wire may comprise an enclosing electrical contact and/or said second shell layer may comprise a transparent electrical contact. The transparent electrical contact may be ITO.

Another example of one embodiment relates to a III-N nanowire LED which includes; a doped core wire (841'), a shell layer (842') having a lower band gap than said core wire (841'), wherein said shell layer is in-situ etched (840'), and wherein said core wire (841') comprises an enclosing electrical contact. The core wire may be in-situ p-doped and at least one shell layer (843') may be an n-doped shell layer.

The core wire may be in-situ n-doped where at least one shell layer is a p-doped shell layer.

Another example of one embodiment is a thin-film device comprising an III nitride nanowire epilayer and III-V nanowires where III nitride nanowires are grown from GaN nanoparticles. The advantage of the embodiment is that it makes it possible to cover the entire light spectrum to make light emitting diodes (overall) providing white light on cheap silicon substrates. Another advantage of the embodiment is that one does not have to use e.g. a phosphorescent layer such as for example blue LEDs to get white light. Shell layers can be etched in-situ to the same height as the core nanowire in order to not get any luminescence from the C plane. The advantage of the embodiment is that the wavelength is more defined when the luminescence differs from the different crystal planes. Furthermore, shifts in the wavelength spectrum with a thin film on silicon are avoided.

In another example of one embodiment of the reinforced thin-film device, the epitaxial elongate protrusions have respective p-i-n-doped segments in the radial direction of which the middle intrinsic segments may be 7-10 nm thick for III-V p-i-n/III-V n-i-p. finCMOSTFET.

An example of an embodiment of the invention relates to a process (1000) for producing a III-V FinFET (420, 424), which includes; providing a substrate comprising an epilayer island (415a, 415b), depositing an epitaxial growth mask layer in contact with said epilayer island where the mask layer deposited for epitaxial growth, lithographically defining an elongated cavity having a nanostructured width centered over said epilayer island; to epitaxially protrude a core portion (420a, 420b) from the elongated cavity to a nanostructure height in a plane perpendicular to the epilayer island (415a, 415b) to produce a 1-dimensional semiconductor in said longitudinal direction for ballistic charge carrier transport, wherein the semiconductor for the epilayer island (415a) is selected from the group III-V semiconductor with high mobility for positive charge carriers or from the group III-V semiconductor with high electron mobility. The process may include growing the protruding core portion with a mask layer; growing a wide bandgap barrier shell along the longitudinal direction of the elongated protruding core portion (420) to produce a central recess filled with an intrinsically doped substantially thin shell; growing an in-situ doped shell on the barrier shell, where the protruding core portion and said in-situ doped shell are doped in-situ to form a p-i-n junction radially at a central portion of said protruding core portion. The central portion may be less than 10 nm and said intrinsic layer may have a nanostructured thickness of less than 7 nm to enclose charge carriers in a 0-dimensional semiconductor in said longitudinal direction. The lengths of the nanowires and the thickness of the epilayer may be less than 400 nm to divert heat from a III-V CMOS circuit.

In another example of an embodiment of the invention, PMOS transistors may include core-shell structure with p-i-n-connected segments, wherein said NMOS transistors comprise core-shell structure with p-i-n-connected segments, preferably wherein said nanowires comprise intrinsically doped segments with a thickness of 5-7 nm. The PMOS transistors may also include nanowires epitaxially grown on epilayer islands where the NMOS transistors include nanowires grown on said epilayer island.

Another example of an embodiment 806 is an epilayer provided by a reinforced thin-film device having a III-N nanowire diode structure which includes; a doped core wire of the crystal structure wurtzite on a substrate, a first shell layer having a lower band gap than the core wire, and where the core wire comprises a second doped shell layer on said first shell layer wherein said core wire is grown on a substrate of another crystal structure than wurtzite. The substrate may be configured for the orientation of <111>A or <111>B zinc blende for the growth of III-V nanowires. The core wire may comprise an enclosing electrical contact.

Another example of one embodiment is a Majorana quantum computer 900 which comprises; a crystalline substrate (901); a first heterostructured nanowire (967) of III-V semiconductor arranged in parallel to said substrate (901) by lateral overgrowth of an elongated groove (961'); a second heterostructure nanowire (966) arranged vertically to said first heterostructure nanowire (967), wherein said second heterostructure nanowire (967) is substantially lattice-matched to said first nanowire with a central abutment; and wherein said vertical nanowire (966) comprises a wide band gap semiconductor material and wherein a superconducting wrap-around-gate electrode (962) encloses said second vertical nanowire (966); and wherein two superconducting electrodes (961, 963) are disposed at the ends of said first nanowire. The superconducting electrodes may be s-wave superconductors. The first heterostructure nanowire and the second vertical heterostructure nanowire, respectively, may be arranged as indium antimonide nanowires. Also, 2D islands of graphene may be arranged to be part of a majorana quantum gate with configured band structure.

Another example of one embodiment relates to a nanotree comprising a tandem heterostructure comprising; a heterostructured nanowire of III-V semiconductor comprising a first and a second island along its axial direction; wherein said first island is configured for a majorana quantum state forming a first quantum bit, wherein said second island is configured for a second majorana quantum state forming a second quantum bit. The heterostructure nanowire may have two substantially short energy barrier segments such that the first quantum bit and second quantum bit may form a superimposed wave function. The heterostructure nanowire may comprise a branch of substantially the same semiconductor as said nanowire to form T-gates. The energy barrier segments may be substantially thin with a thickness of 2-3 nm.

Another example of an embodiment 1100" refers to a III-V semiconductor gate that includes; a 3-way intersection of III-V semiconductors (1153, 1157, 1154) which comprises three nanowire segments to perform a topological braid operation of two majorana wave functions for majorana fermions, wherein each nanowire segment comprises at least one heterostructure with a substantially thin energy barrier material.

Preferred Embodiments

A reinforced thin-film device (100, 200, 500) comprising; a substrate (101) having a top surface for supporting an epilayer; a mask layer (103) patterned with a plurality of nanosize cavities (102, 102') disposed on said substrate (101) to form a needle pad; a thin-film (105) of lattice-mismatched semiconductor disposed on said mask layer (103), wherein said thin-film (105) comprises a plurality of in parallel spaced semiconductor needles (104, 204) of said lattice-mismatched semiconductor embedded in said thin-film (105), wherein said plurality of semiconductor needles (104, 204) are substantially vertically disposed in the axial direction toward said substrate (101) in said plurality of nanosize cavities (102, 102') of said mask layer (103), and wherein a lattice-mismatched semiconductor epilayer (106) is provided on said thin-film supported thereby; preferably wherein said substrate (101) is a silicon wafer greater than 2 inches in diameter. The plurality of in parallel spaced semiconductor needles (204) of lattice-mismatched semiconductor may be arranged in a hexagonally close-packed structure at a distance of 50-100 nm of lattice-mismatched semiconductor. The plurality of nanosize cavities (102, 102') may be nanosize holes configured with a hole diameter of 5-25 nm to provide said semiconductor needles (104, 104) of the same thickness in said nanosize holes. The epilayer may comprise a plurality of isolated islands of at least two different lattice-mismatched semiconductors (406). The thin-film (505) may be arranged in germanium (505) and said epilayer is graphene (506). The nanosize cavities (102, 102') may be substantially deep. The epilayer may comprise semiconductor fins of the same semiconductor material as said epilayer. The semiconductor islands may be substantially densely packed at a distance of 200-500 nm. The epilayer may comprise at least one heterostructure (506, 606) of III-V semiconductor alloy with different bandgaps having a 1-10 nm thin middle layer. The middle layer may have a smaller band gap than the abutting semiconductor in said heterostructure (506, 606). The semiconductor needles may have at least a portion which is wurtzite crystal structure.

Although modifications and changes may be suggested by those skilled in the art, it is the intent of the inventor to, within the scope of the disclosure herein, that the invention encompasses the scope of all modifications and modifications which reasonably and properly fall within the scope of the disclosure disclosed herein. The present invention has been described above with reference to specific embodiments. However, other embodiments than the above described are equally possible within the scope of the invention. Different method steps than those described above, may be provided within the scope of the invention. The different features and steps of the invention may be combined in other combinations than those described. For example, various features of embodiments may be combined in combinations other than those described mutatis mutandis. The scope of the invention is limited only by the appended claims.

What is claimed is:

1. A reinforced thin-film device comprising:
   a substrate having a top surface for supporting an epilayer;
   a thin-film of, relative to the substrate, lattice-mismatched semiconductor disposed above said substrate, wherein said thin-film comprises a plurality of in parallel spaced semiconductor needles of said lattice-mismatched semiconductor embedded in said thin-film, wherein said plurality of semiconductor needles are vertically disposed in the axial direction towards said substrate;
   a, relative to the substrate, lattice-mismatched semiconductor epilayer provided on said thin-film and supported thereby; and
   a FinFET transistor arranged on the lattice-mismatched semiconductor epilayer, the FinFET transistor comprising:
      a fin semiconductor structure comprising an elongate protruding core portion, the fin semiconductor structure being arranged on the lattice-mismatched semiconductor epilayer,
      a first and a second nanostructured electrode enclosing respectively a source end and a drain end of the protruding core portion, and
      a nanostructured gate electrode enclosing a central portion of the protruding core portion, the central portion being a portion of the protruding core portion between the source end and the drain end.

2. The reinforced thin-film device of claim 1, wherein the FinFET transistor further comprises an oxide shell enclosing the protruding core portion, the oxide shell being arranged between the nanostructured gate electrode and the protruding core portion.

3. The reinforced thin-film device of claim 2, wherein the oxide shell is a high-k dielectric oxide shell.

4. The reinforced thin-film device of claim 2, wherein said oxide shell is amorphous hafnium oxide.

5. The reinforced thin-film device of claim 1, wherein the protruding core portion is pnp-doped with the source end and the drain end being p-doped and the central portion of the protruding core portion being n-doped.

6. The reinforced thin-film device of claim 1, wherein the protruding core portion is npn-doped with the source end and the drain end being n-doped and the central portion of the protruding core portion being p-doped.

7. The reinforced thin-film device of claim 1, wherein the protruding core portion has a length of 50-200 nm.

8. The reinforced thin-film device of claim 1, wherein said semiconductor needles have at least a portion which is wurtzite crystal structure.

9. The reinforced thin-film device of claim 1, wherein said protruding core portion comprises germanium or InGaAs.

10. The reinforced thin-film device of claim 1, wherein the protruding core portion has a width of 7-18 nm or 5-50 nm.

11. The reinforced thin-film device of claim 1, wherein the lattice-mismatched semiconductor epilayer is an epilayer island.

12. The reinforced thin-film device of claim 11, wherein said epilayer island is arranged in a recess or a major aperture.

13. The reinforced thin-film device of claim 1, wherein the substrate is a silicon wafer.

14. The reinforced thin-film device of claim 1, wherein the thin-film comprises gallium nitride.

15. The reinforced thin-film device of claim 1, wherein the semiconductor needles comprise AlGaN.

16. The reinforced thin-film device of claim 15, wherein the semiconductor needles are embedded in GaN.

* * * * *